(12) United States Patent
Park et al.

(10) Patent No.: US 10,115,799 B2
(45) Date of Patent: Oct. 30, 2018

(54) NON-VOLATILE MEMORY DEVICES AND MANUFACTURING METHODS THEREOF

(71) Applicants: Jin Taek Park, Hwaseong-si (KR); Young Woo Park, Seoul (KR); Jae Duk Lee, Seongnam-si (KR)

(72) Inventors: Jin Taek Park, Hwaseong-si (KR); Young Woo Park, Seoul (KR); Jae Duk Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/408,017

(22) Filed: Jan. 17, 2017

(65) Prior Publication Data

US 2017/0125540 A1 May 4, 2017

Related U.S. Application Data

(63) Continuation of application No. 14/457,220, filed on Aug. 12, 2014, now Pat. No. 9,564,519.

(30) Foreign Application Priority Data

Nov. 13, 2013 (KR) ......................... 10-2013-0137491

(51) Int. Cl.
*H01L 29/51* (2006.01)
*H01L 29/66* (2006.01)
(Continued)

(52) U.S. Cl.
CPC ........ *H01L 29/513* (2013.01); *G11C 16/0483* (2013.01); *H01L 21/28273* (2013.01);
(Continued)

(58) Field of Classification Search
CPC ............. H01L 29/513; H01L 27/11582; H01L 27/11556; H01L 29/42364
See application file for complete search history.

(56) References Cited

U.S. PATENT DOCUMENTS 8,084,805 B2   12/2011   Shim et al.
8,163,617 B2   4/2012    Ahn
(Continued)

FOREIGN PATENT DOCUMENTS

CN   101894805 A   11/2010
CN   102184740 A   9/2011
(Continued)

OTHER PUBLICATIONS

First Office Action, Chinese Patent Application No. 201410641349.3, dated Jun. 27, 2018, 18 pages.

*Primary Examiner* — Jay C Chang
*Assistant Examiner* — Mikka Liu
(74) *Attorney, Agent, or Firm* — Ward and Smith, P.A.

(57) ABSTRACT

There is provided a method of manufacturing a non-volatile memory device including: alternatively stacking a plurality of insulating layers and a plurality of conductive layers on a top surface of a substrate; forming an opening that exposes the top surface of the substrate and lateral surfaces of the insulating layers and the conductive layers; forming an anti-oxidation layer on at least the exposed lateral surfaces of the conductive layers; forming a gate dielectric layer on the anti-oxidation layer, the gate dielectric layer including a blocking layer, an electric charge storage layer, and a tunneling layer that are sequentially formed on the anti-oxidation layer; and forming a channel region on the tunneling layer.

20 Claims, 22 Drawing Sheets

(51) Int. Cl.

| | | |
|---|---|---|
| *H01L 29/778* | (2006.01) | |
| *H01L 29/792* | (2006.01) | |
| *H01L 27/11556* | (2017.01) | |
| *H01L 27/11582* | (2017.01) | |
| *G11C 16/04* | (2006.01) | |
| *H01L 21/28* | (2006.01) | |
| *H01L 29/423* | (2006.01) | |
| *H01L 29/49* | (2006.01) | |

(52) U.S. Cl.
  CPC .. *H01L 27/11556* (2013.01); *H01L 27/11582* (2013.01); *H01L 29/4234* (2013.01); *H01L 29/42324* (2013.01); *H01L 29/4916* (2013.01); *H01L 29/66825* (2013.01); *H01L 29/66833* (2013.01); *H01L 29/7789* (2013.01); *H01L 29/7926* (2013.01); *H01L 29/42364* (2013.01)

(56) References Cited

U.S. PATENT DOCUMENTS

| | | | |
|---|---|---|---|
| 8,236,650 B2 | 8/2012 | Son et al. | |
| 8,283,228 B2 | 10/2012 | Alsmeier | |
| 2005/0199877 A1 | 9/2005 | Dip et al. | |
| 2007/0090453 A1 | 4/2007 | Lee et al. | |
| 2008/0237700 A1 | 10/2008 | Kim et al. | |
| 2009/0023279 A1 | 1/2009 | Kim et al. | |
| 2009/0242967 A1 | 10/2009 | Katsumata et al. | |
| 2010/0258852 A1 | 10/2010 | Lim et al. | |
| 2010/0308396 A1 | 12/2010 | Shin | |
| 2011/0024818 A1 | 2/2011 | Ahn | |
| 2011/0073866 A1 | 3/2011 | Kim et al. | |
| 2011/0233648 A1* | 9/2011 | Seol | H01L 21/32137 257/324 |
| 2011/0303971 A1 | 12/2011 | Lee et al. | |
| 2012/0049268 A1 | 3/2012 | Chang et al. | |
| 2012/0146125 A1 | 6/2012 | Kim et al. | |
| 2012/0156848 A1 | 6/2012 | Yang et al. | |
| 2012/0184078 A1 | 7/2012 | Kiyotoshi | |
| 2012/0275220 A1 | 11/2012 | Liu et al. | |
| 2013/0069141 A1 | 3/2013 | Pan et al. | |

FOREIGN PATENT DOCUMENTS

| | | |
|---|---|---|
| CN | 102201416 A | 9/2011 |
| CN | 102544017 A | 7/2012 |
| JP | 2012-151187 A | 8/2012 |
| KR | 100851552 B1 | 8/2008 |
| KR | 1020090098733 A | 9/2009 |
| KR | 1020110013773 A | 2/2011 |
| KR | 1020110034816 A | 4/2011 |
| KR | 1020120120537 A | 11/2012 |

* cited by examiner

NON-VOLATILE MEMORY DEVICES AND MANUFACTURING METHODS THEREOF

CROSS-REFERENCE TO RELATED APPLICATION

This application is a Continuation of U.S. application Ser. No. 14/457,220, filed on Aug. 12, 2014, which claims priority under 35 U.S.C. § 119 to Korean Patent Application No. 10-2013-0137491, filed on Nov. 13, 2013 with the Korean Intellectual Property Office, the disclosure of which is incorporated herein by reference in its entirety.

BACKGROUND

The present disclosure relates to non-volatile memory devices and to manufacturing methods thereof and, more particularly, to non-volatile memory devices having a vertical structure and to methods of manufacturing such devices.

Electronic products have been miniaturized, while still requiring high capacity data processing. Thus, semiconductor memory devices having increased integration are in demand for use in these electronic products. As one method for enhancing integration of semiconductor memory devices, a non-volatile memory device having a vertical transistor structure, instead of a planar transistor structure, has been proposed.

SUMMARY

An aspect of the present disclosure may provide non-volatile memory devices that include an anti-oxidation layer that may protect the gate electrodes of the device to improve reliability, and a manufacturing method thereof.

According to an aspect of the present disclosure, non-volatile memory devices may include: a channel region extending in a direction perpendicular to an upper surface of a substrate; gate electrodes and interlayer insulating layers alternately stacked on the upper surface of the substrate along outer side walls of the channel region; a gate dielectric layer including a tunneling layer, an electric charge storage layer, and a blocking layer including a high-k layer and a low-k layer that is between the high-k layer and the electric charge storage layer, the tunneling layer, the electric charge storage layer, and the blocking layer being sequentially disposed between the channel region and the gate electrodes; and an anti-oxidation layer disposed between the blocking layer and the gate electrodes to protect the gate electrodes from oxidation.

The anti-oxidation layer may extend along the channel region perpendicular to the upper surface of the substrate from a bottom gate electrode that is closest to the substrate to a top gate electrode that is farthest away from the substrate.

The anti-oxidation layer may have a substantially uniform thickness along the channel region.

A difference between a thickness of a first region of the anti-oxidation layer that contacts the bottom gate electrode and a thickness of a second region that contacts the top gate electrode may be less than or equal to 25% of an average thickness of the anti-oxidation layer.

The anti-oxidation layer may include a dielectric material that is different from that of the high-k layer.

The anti-oxidation layer may have dielectric constant that is lower than a dielectric constant of the high-k layer.

The anti-oxidation layer may have a thickness smaller than that of the low-k layer.

The gate electrodes may include metal silicide, and the blocking layer may include an oxide.

The anti-oxidation layer may be disposed on lateral surface regions of the gate electrodes that face the channel region.

The anti-oxidation layer may be discontinuous between adjacent gate electrodes.

The anti-oxidation layer may have a bent portion formed in a boundary with the interlayer insulating layers in a direction in which the channel region extends.

Lateral surfaces of the anti-oxidation layer that are opposite the gate electrodes may not be coplanar with lateral surfaces of the interlayer insulating layers.

The non-volatile memory device may further include an epitaxial layer disposed on the substrate in a lower portion of the channel region.

According to another aspect of the present disclosure, methods of manufacturing a non-volatile memory device are provided in which a plurality of insulating layers and a plurality of conductive layers are alternatively stacked a top surface of a substrate. An opening is formed through the insulating layers and the conductive layers that exposes the top surface of the substrate and lateral surfaces of the insulating layers and the conductive layers. An anti-oxidation layer is formed on at least the exposed lateral surfaces of the conductive layers. A gate dielectric layer is formed on the anti-oxidation layer, the gate dielectric layer including a blocking layer, an electric charge storage layer, and a tunneling layer that are sequentially formed on the anti-oxidation layer. A channel region is formed on the tunneling layer.

The anti-oxidation layer may be a dielectric material that is different than a dielectric material of a portion of the blocking layer that directly contacts the anti-oxidation layer.

The anti-oxidation layer may be a discontinuous layer that completely covers the exposed lateral surfaces of the conductive layers but that does not completely cover the exposed lateral surfaces of insulating layers that are disposed between two conductive layers.

Portions of the anti-oxidation layer that are formed on the exposed lateral surfaces of the conductive layers may have a substantially uniform thickness.

The blocking layer may be a multi-layer structure having a first blocking layer that includes a low dielectric constant material that contacts the electric charge storage layer and a second blocking layer that includes a high dielectric constant material between the first blocking layer and the anti-oxidation layer.

The anti-oxidation layer may have a dielectric constant that is lower than a dielectric constant of the first blocking layer.

A thickness of the anti-oxidation layer may be smaller than a thickness of the first blocking layer.

A maximum difference between a thickness of a portion of the anti-oxidation layer that is formed on the exposed lateral surface of one of the conductive layers and the thickness of a portion of the anti-oxidation layer that is formed on the exposed lateral surface of another one of the conductive layers may be less than or equal to 25% of an average thickness of the anti-oxidation layer.

The conductive layers may be gate electrodes.

The anti-oxidation layer may extend along the channel region perpendicular to the upper surface of the substrate from a bottom gate electrode that is closest to the substrate to a top gate electrode that is farthest away from the substrate.

The gate electrodes may include metal silicide, and the blocking layer may include an oxide.

Lateral surfaces of the anti-oxidation layer that are opposite the gate electrodes may not be coplanar with lateral surfaces of the interlayer insulating layers.

The non-volatile memory device may also include an epitaxial layer disposed on the substrate in a lower portion of the channel region.

The blocking layer may be formed using an oxygen-containing gas.

The anti-oxidation layer may be formed via an atomic layer deposition process or via a chemical vapor deposition process at a temperature that does not substantially oxidize exposed portions of the conductive layers.

According to another aspect of the present disclosure, a method of manufacturing a non-volatile memory device may include: alternately stacking interlayer insulating layers and conductive layers on a substrate; forming openings by penetrating through the interlayer insulating layers and the conductive layers that expose the substrate; forming an anti-oxidation layer on the conductive layers exposed through side walls of the openings using a deposition process that is conducted at a temperature which is insufficient to oxidize the exposed portions of the conductive layers; sequentially forming a blocking layer including a high-k layer and a low-k layer, an electric charge storage layer, and a tunneling layer on the anti-oxidation layer to form a gate dielectric layer; and forming a channel region on the gate dielectric layer.

The high-k layer may be formed by using oxygen-containing gas.

The anti-oxidation layer may be formed via an atomic layer deposition process or via a chemical vapor deposition process.

Portions of the anti-oxidation layer that are formed on the exposed lateral surfaces of the conductive layers may have a substantially uniform thickness.

The anti-oxidation layer may be a dielectric material that is different than a dielectric material of a portion of the blocking layer that directly contacts the anti-oxidation layer.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
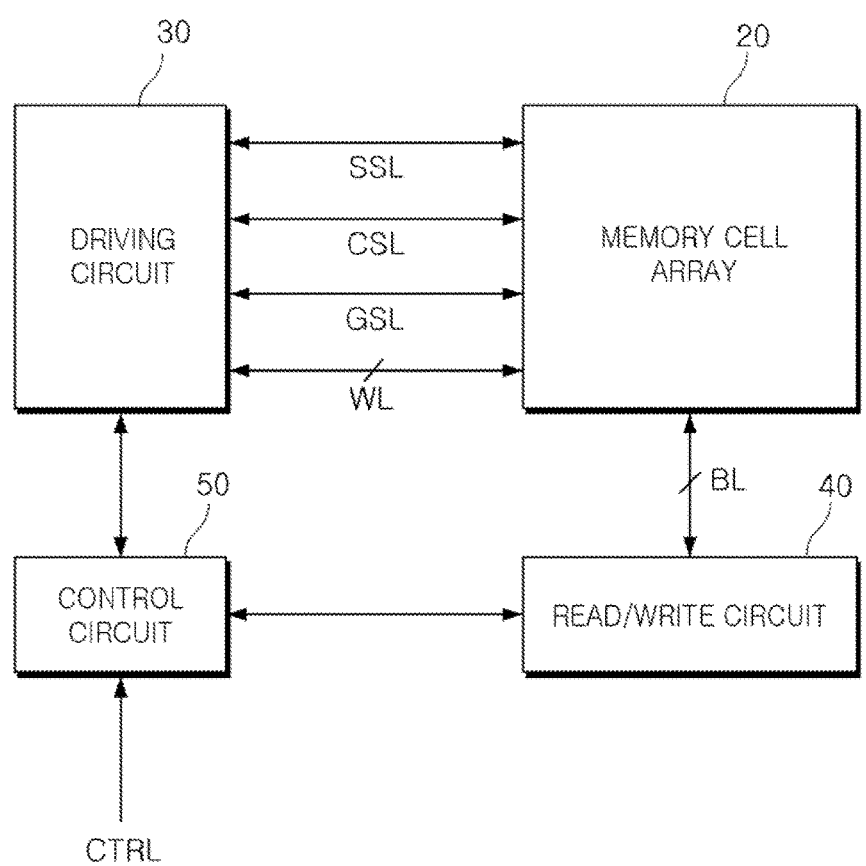
FIG. 1 is a block diagram schematically illustrating a non-volatile memory device according to an exemplary embodiment of the present disclosure.

Hereinafter, exemplary embodiments of the present disclosure will be described in detail with reference to the accompanying drawings. The disclosure may, however, be exemplified in many different forms and should not be construed as being limited to the specific exemplary embodiments set forth herein. Rather, these exemplary embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

It also will be understood that, as used herein, the terms "row" and "column" indicate two non-parallel directions that may be orthogonal to one another. However, the terms row and column do not indicate a particular horizontal or vertical orientation.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated elements but do not preclude the presence or addition of one or more other elements.

FIG. 1 is a block diagram schematically illustrating a non-volatile memory device according to an exemplary embodiment of the present disclosure.

Referring to FIG. 1, a non-volatile memory device 10 according to an exemplary embodiment of the present disclosure may include a memory cell array 20, a driving circuit 30, a read/write circuit 40, and a control circuit 50.

The memory cell array 20 may include a plurality of memory cells, and the plurality of memory cells may be arranged in a plurality of columns and rows. The plurality of memory cells included in the memory cell array 20 may be connected to the driving circuit 30 through word lines WL, at least one common source line CSL, string select lines SSL, ground select lines GSL, etc., and may be connected to the read/write circuit 40 through bit lines BL. In an exemplary embodiment of the present disclosure, the memory cells that are arranged in the same row may be connected to the same word line WL, and the memory cells that are arranged in the same column may be connected to the same bit line BL.

The memory cells included in the memory cell array 20 may be divided into a plurality of memory blocks. Each of the memory blocks may include a plurality of word lines WL, a plurality of string select lines SSL, a plurality of ground select lines GSL, a plurality of bit lines BL, and at least one common source line CSL.

Operation of the driving circuit 30 and the read/write circuit 40 may be controlled by the control circuit 50. In an exemplary embodiment of the present disclosure, the driving circuit 30 may receive address information from the outside, decode the received address information, and select word lines WL, common source lines CSL, string source lines SSL, and/or ground select lines GSL that are connected to the memory cell array 20 in response to the received address information. The driving circuit 30 may include a driving circuit with respect to each of the word lines WL, the string select lines SSL, and the common source lines CSL.

The read/write circuit 40 may select bit lines BL that are connected to the memory cell array 20 according to commands received from the control circuit 50. The read/write circuit 40 may read out data stored in a memory cell connected to a selected bit line BL or write data into the memory cell connected to a selected bit line BL. In order to perform these operations, the read/write circuit 40 may include circuits such as a page buffer, an input/output buffer, a data latch and the like.

The control circuit 50 may control operations of the driving circuit 30 and the read/write circuit 40 in response to a control signal CTRL that is received from an external source. In the case of reading data stored in the memory cell array 20, the control circuit 50 may control the driving circuit 30 to supply a voltage for a reading operation to a word line WL that is connected to a memory cell from which the stored data is to be read from. When the voltage for the reading operation is supplied to this word line WL, the control circuit 50 may control the read/write circuit 40 to read out data stored in the memory cell.

In writing data to the memory cell array 20, the control circuit 50 may control the driving circuit 30 to supply a voltage for a write operation to a word line that is connected to a memory cell to which data is to be written. When the voltage for a write operation is supplied to this word line WL, the control circuit 50 may control the read/write circuit 40 to write data to the memory cell.

Figure 2:
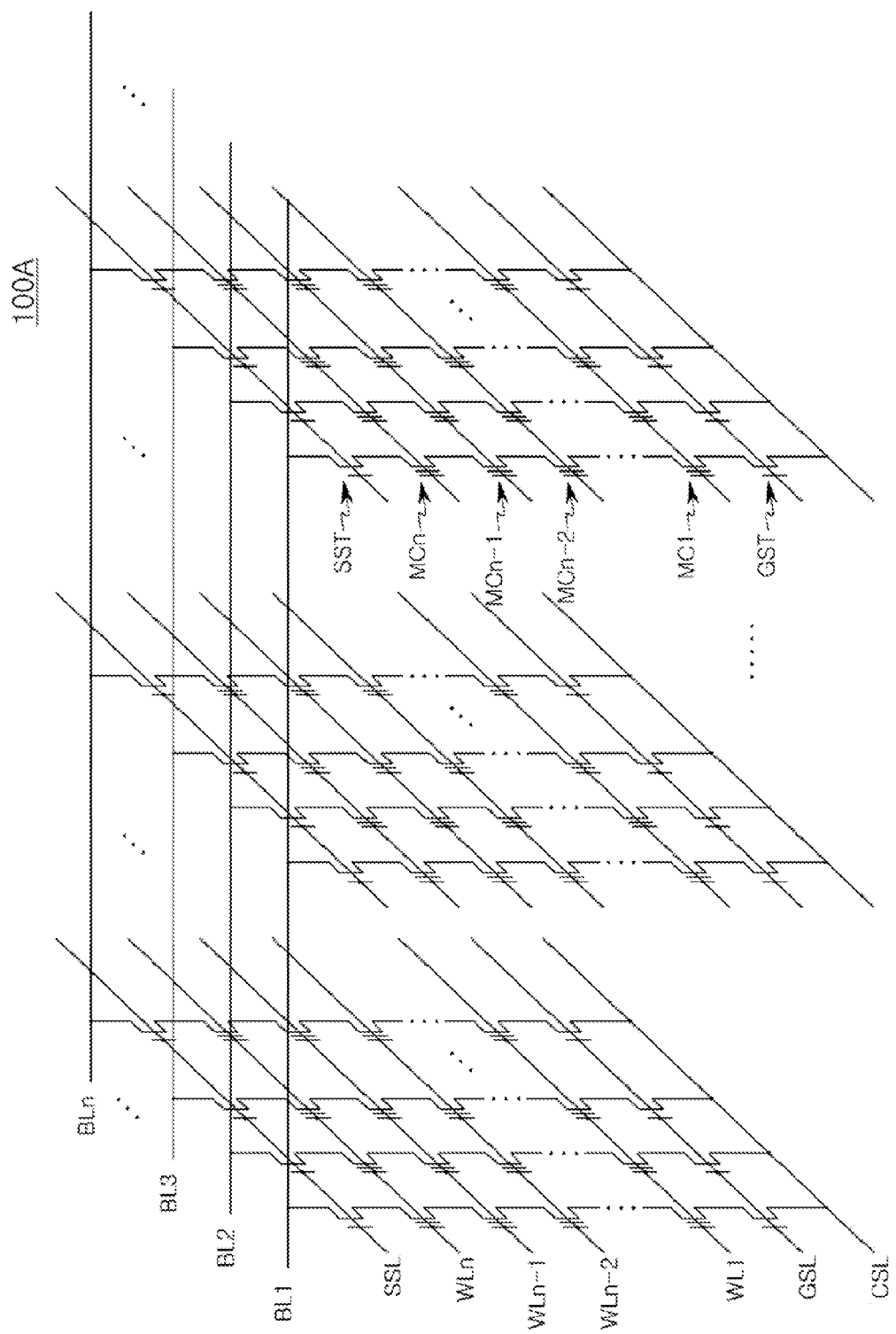
FIG. 2 is an equivalent circuit diagram of a memory cell array of a non-volatile memory device according to an exemplary embodiment of the present disclosure.

FIG. 2 is an equivalent circuit diagram of a memory cell array of a non-volatile memory device according to an exemplary embodiment of the present disclosure.

Specifically, FIG. 2 is an equivalent circuit diagram illustrating a three-dimensional (3D) structure of a memory cell array included in a vertical non-volatile memory device 100A. Referring to FIG. 2, the memory cell array according to the present exemplary embodiment may include a plurality of memory cell strings that each include n memory cell elements MC1 to MCn that are electrically connected in series, and a ground select transistor GST and a string select transistor SST that are electrically connected in series to the respective ends of each string of memory cell elements MC1 to MCn.

The n memory cell elements MC1 to MCn that are included in each string may be connected to word lines WL1 to WLn, respectively, for selecting the memory cell elements MC1 to MCn.

A gate terminal of each ground select transistor GST may be connected to a respective one of the ground select lines GSL, and a source terminal of each of the ground select lines GSL may be connected to a respective one of the common source lines CSL. Meanwhile, a gate terminal of each string select transistor SST may be connected to a respective one of the string select lines SSL, and a source terminal thereof may be connected to a drain terminal of a respective one of the memory cell elements MCn. In FIG. 2, the illustrated structure has a single ground select transistor GST and a single string select transistor SST connected to each string of n memory cell elements MC1 to MCn, but alternatively, a plurality of ground select transistors GST and a plurality of string select transistors SST may be connected to each string of n memory cell elements MC1 to MCn.

A drain terminal of each string select transistor SST may be connected to one of the bit lines BL1 to BLm. When a signal is applied to the gate terminal of one of the string select transistors SST through the string select line SSL, a signal applied through the bit line BL1 to BLm to which the string select transistor SST is connected may be delivered to the n memory cell elements MC1 to MCn that are connected in series to the string select transistor SST to execute a data read or write operation. Also, by applying a signal to the gate terminal of one of the ground select transistors GST through the ground select line GSL, an erase operation to remove all of electric charges stored in the n memory cell elements MC1 to MCn of the string that includes the ground select transistor GSL may be executed.

Figure 3:
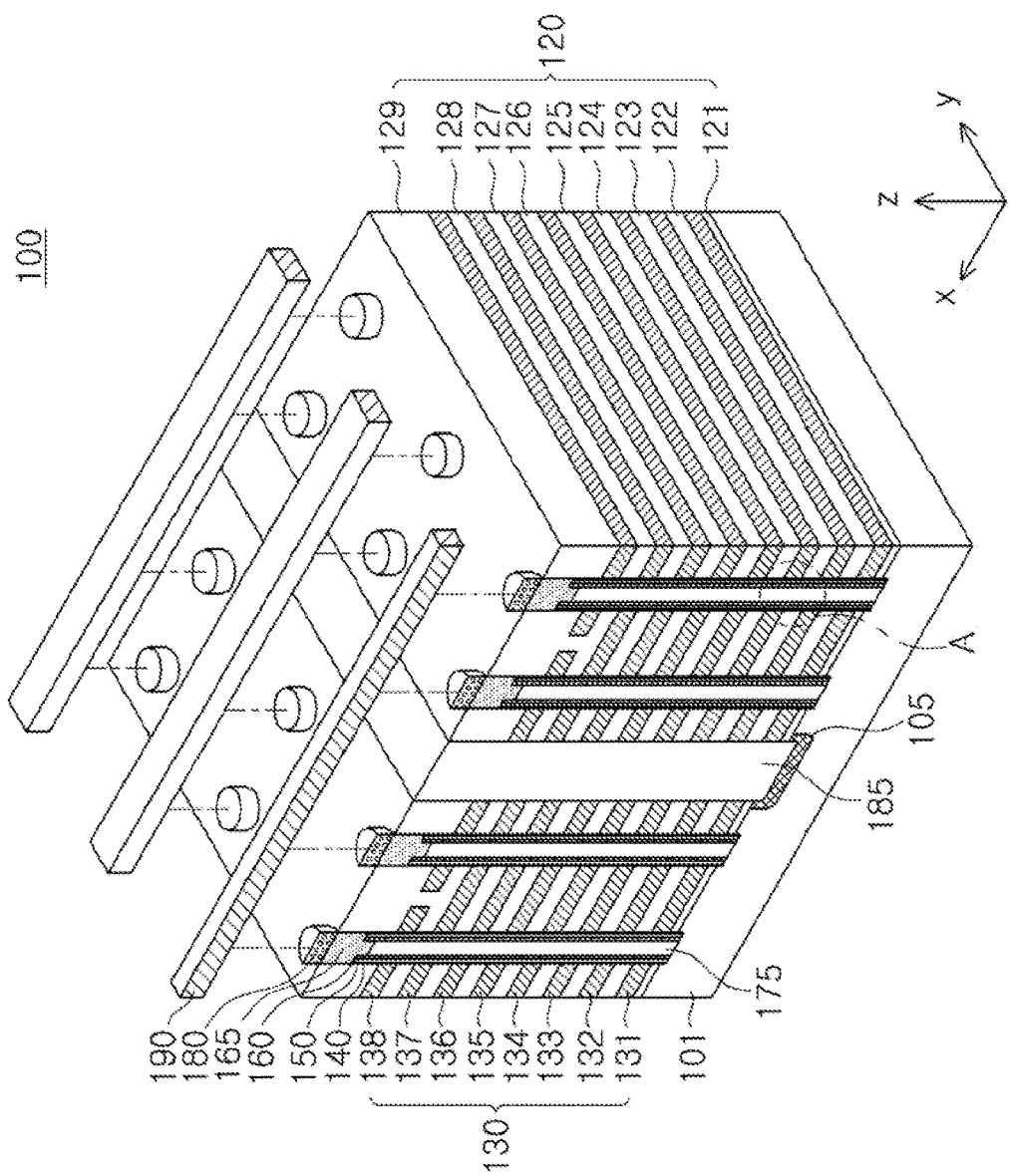
FIG. 3 is an exploded perspective view schematically illustrating a structure of memory cell strings of a non-volatile memory device according to an exemplary embodiment of the present disclosure.

FIG. 3 is an exploded perspective view schematically illustrating a structure of memory cell strings of a non-volatile memory device according to an exemplary embodiment of the present disclosure.

Referring to FIG. 3, a non-volatile memory device 100 may include channel regions 160 that extend in a direction perpendicular to an upper surface of a substrate 101. The device 100 further includes a plurality of interlayer insulating layers 120 and a plurality of gate electrodes 130 stacked along outer walls of the channel regions 160. The non-volatile memory device 100 may further include anti-oxidation layers 140 and gate dielectric layers 150 that are disposed between the gate electrodes 130 and each channel region 160, and may also include bit lines 190 that are disposed above respective rows of channel regions 160.

In the non-volatile memory device 100, a single memory cell string may be configured with each channel region 160 as a center, and a plurality of memory cell strings may be arranged in rows and columns in the x and y directions of FIG. 3.

The substrate 101 may have an upper surface that extends in the x and y directions of FIG. 3. The substrate 101 may include a semiconductor material, for example, a Group IV semiconductor, a Group III-V compound semiconductor, or a Group II-VI oxide semiconductor. For example, the Group IV semiconductor may include silicon, germanium, or silicon-germanium. The substrate 101 may be provided as a bulk wafer or an epitaxial layer.

Each channel region 160 may extend in a direction perpendicular to the upper surface of the substrate 101. The channel regions 160 may each have an annular shape and may surround a buried insulating layer 175 that is disposed in the center of the annular shaped channel region 160. In other embodiments, the channel regions 160 may have a column shape such as a cylindrical shape or a prismatic shape. The buried insulating layer 175 may be omitted in some embodiments. In some embodiments, the channel region 160 may have a sloped lateral surface so that the channel region 160 becomes narrower the closer it is to the substrate 101.

The channel regions 160 may be spaced apart from one another in the x and y directions as is shown in FIG. 3. However, it will be appreciated that the channel regions 160 may be variously disposed, and, for example, the channel regions 160 may be disposed in zigzags in at least one direction. A separating insulating layer 185 may be interposed between some of the rows of channel regions 160, but the present disclosure is not limited thereto.

A lower surface of each channel region 160 may directly contact the substrate 101 and may be electrically connected thereto. Each channel region 160 may include a semiconductor material such as polysilicon or single crystalline silicon, and the semiconductor material may be an undoped material or a material including p-type or n-type impurities.

A plurality of gate electrodes 130 (specifically, gate electrodes 131 to 138 in the embodiment of FIG. 3) may be spaced apart from one another in the z direction along the lateral surfaces of the channel regions 160. Referring to FIG. 2 as well, the gate electrodes 130 may form gates for the ground select transistors GST, the memory cells MC1 to MCn, and the string select transistors SST. The gate electrodes 130 may extend to form the word lines WL1 and WLn, and may be commonly connected in a predetermined unit of adjacent memory strings arranged in the x and y directions. In the exemplary embodiment illustrated in FIG. 3, the six gate electrodes 132 to 137 comprise the gate electrodes for the memory cells MC1 to MCn, but this is merely illustrative and the number of the gate electrodes 132 to 137 constituting the memory cells MC1 to MCn may be determined according to capacity of the non-volatile memory device 100. For example, the number of gate electrodes 132 to 137 constituting the memory cells MC1 to MCn may be $2^n$ (n being a natural number).

The gate electrode 131 of the ground select transistor GST may extend in the y direction to form the ground select line GSL. The gate electrode 138 of the string select transistor SST may extend in the y direction to form the string select line SSL. As shown in FIG. 3, the gate electrode 138 of the string select transistor SST may be discontinuous in the x direction between adjacent memory cell strings to form multiple string select lines SSL. However, the present disclosure is not limited thereto, and the gate electrode 138 may be connected between adjacent memory cell strings in the x direction according to an exemplary embodiment. In this case, the wiring structure including the bit lines 190 such that adjacent memory cell strings are connected to different bit lines 190 may be altered. According to an exemplary embodiment, the string select transistor SST may have two or more gate electrodes 138 and the ground select transistor GST may have two or more gate electrodes 131, and the two or more gate electrodes 138 of the string select transistor SST and the two or more gate electrodes 131 of the ground select transistor GST may have a structure that differs from the structure of the gate electrodes 132 to 137 of the memory cells MC1 to MCn.

The gate electrodes 130 may include, for example, polysilicon or metal silicide material. The metal silicide material may be silicide material of a metal selected from among cobalt (Co), nickel (Ni), hafnium (Hf), platinum (Pt), tungsten (W), and titanium (Ti). According to an exemplary embodiment, the gate electrodes 130 may include a metal, for example, tungsten (W). Also, although not shown, the gate electrodes 130 may further include a diffusion barrier, and the diffusion barrier may include, for example, at least one of tungsten nitride (WN), tantalum nitride (TaN), and titanium nitride (TiN).

The interlayer insulating layers 121 to 129 (120) may be arranged between the gate electrodes 130. Like the gate electrodes 130, the interlayer insulating layers 120 may be arranged to be spaced apart from one another in the z direction and may extend in the y direction. However, the eighth interlayer insulating layer 128 and the ninth interlayer insulating layer 129 may be connected between the gate electrodes 138 of the string select transistor SST.

The interlayer insulating layers 120 may include an insulting material such as silicon oxide or silicon nitride.

Gate dielectric layers 150 may be disposed between the gate electrodes 130 and each channel region 160. Although not specifically illustrated in FIG. 3, each gate dielectric layer 150 may include a tunneling layer, an electric charge storage layer, and a blocking layer sequentially stacked on the channel region 160, details of which will be described with reference to FIGS. 4 and 5 hereinbelow.

The tunneling layer may tunnel electric charges to the electric charge storage layer via Fowler-Nordheim (FN) tunneling. The tunneling layer may include, for example, a silicon oxide. The electric charge storage layer may be an electric charge trap layer or a floating gate conductive layer. For example, the electric charge storage layer may include a dielectric material, quantum dots, or nanocrystals. Here, the quantum dots or the nanocrystals may be formed of microparticles of a conductor such as, for example, a metal or a semiconductor. The blocking layer may include a high-k dielectric material. Here, the high-k dielectric material refers to a dielectric material having a dielectric constant higher than that of silicon oxide.

The anti-oxidation layers 140 may be disposed between the gate electrodes 130 and the gate dielectric layers 150 and may be contiguous with lateral surfaces of the gate electrodes 130. The anti-oxidation layers 140 may help prevent the gate electrodes 130 from being oxidized during a manufacturing process. Details of the anti-oxidation layers 140 will be described with reference to FIGS. 6 and 10 hereinbelow.

Each anti-oxidation layer 140 may extend downwardly along a respective one of the channel regions to contact an upper surface of the substrate 101. Each anti-oxidation layer 140 may have a substantially uniform thickness along its respective channel region 160. In the present disclosure, an anti-oxidation layer is considered to have a substantially uniform thickness if the difference between the thicknesses of portions of the anti-oxidation layer 140 that are contiguous with different gate electrodes 130 is smaller than an average thickness of the anti-oxidation layer 140. In some embodiments, a difference between a thickness of a portion of the anti-oxidation layer 140 that is contiguous with the gate electrode 131 and a thickness of the portion of the anti-oxidation layer 140 that is contiguous with gate electrode 138 may be less than or equal to 25% of the average thickness of the anti-oxidation layer 140. In other embodiments, a difference between a thickness of a portion of the anti-oxidation layer 140 that is contiguous with the gate electrode 131 and a thickness of the portion of the anti-oxidation layer 140 that is contiguous with gate electrode 138 may be less than or equal to 10% of the average thickness of the anti-oxidation layer 140. For example, in a case in which the average thickness of the anti-oxidation layer 140 ranges from 5 Å to 40 Å, a difference between thicknesses of the portions of the anti-oxidation layers 140 contiguous with two of the gate electrodes 130 may be less than or equal to 10 Å. The anti-oxidation layers 140 may have substantially uniform thickness throughout the nonvolatile memory device 100, as well as within the individual memory cell strings.

The anti-oxidation layers 140 may include a dielectric material and, for example, may be formed of a dielectric material different from the dielectric material included in the blocking layers of the gate dielectric layers 150. For example, the anti-oxidation layers 140 may be formed of a material having a dielectric constant K that is lower than that of the high-K dielectric layer 156a (please refer to FIG. 4), but the present disclosure is not limited thereto.

In an upper end of each memory cell string, a drain region 165 may cover an upper surface of the buried insulating layer 175 and be electrically connected to the channel region 160. The drain region 165 may comprise, for example, doped polysilicon. The drain region 165 may act as a drain region of the string select transistor SST (please refer to FIG. 2).

A conductive contact plug 180 may be disposed on an upper portion of the drain region 165 and connected to one of the bit lines 190. The contact plug 180 may be connected to the drain region 165 by penetrating through an upper portion of the ninth interlayer insulating layer 129. In FIG. 3, the upper portion of the ninth interlayer insulating layer 129 that surrounds the lateral surfaces of the contact plugs 180 is omitted from illustration in order to more clearly illustrate other portions of the memory device.

The bit lines 190 may be connected to upper portions of a row of drain regions 165 that are arranged in the x direction.

Source regions 105 of the ground select transistors GST (please refer to FIG. 2) that are spaced apart from each other in the x direction may be disposed in lower ends of the memory cell strings. The source regions 105 may be in or adjacent to the upper surface of the substrate 101, may extend in the y direction, and be spaced apart from one another by a predetermined distance in the x direction. In some embodiments, one source region 105 may be arranged between every two channel regions 160 in the x direction, but the present disclosure is not limited thereto. The separating insulating layer 185 may be formed on each source region 105.

In a case in which the source region 105 has a conductivity type opposite to that of the substrate 101, the source region 105 may act as a source region for adjacent ground select transistors GST and be connected to the common source line CSL of FIG. 2. In a case in which the source region 105 has the same conductivity type as that of the substrate 101, the source region 105 may act as a pocket P well contact for an erase operation of block units of the memory cell strings. In this case, as a high voltage is applied to the substrate 101 through the pocket P well contact electrode, data stored in all of the memory cells within a corresponding memory cell block may be erased.

Figure 4:
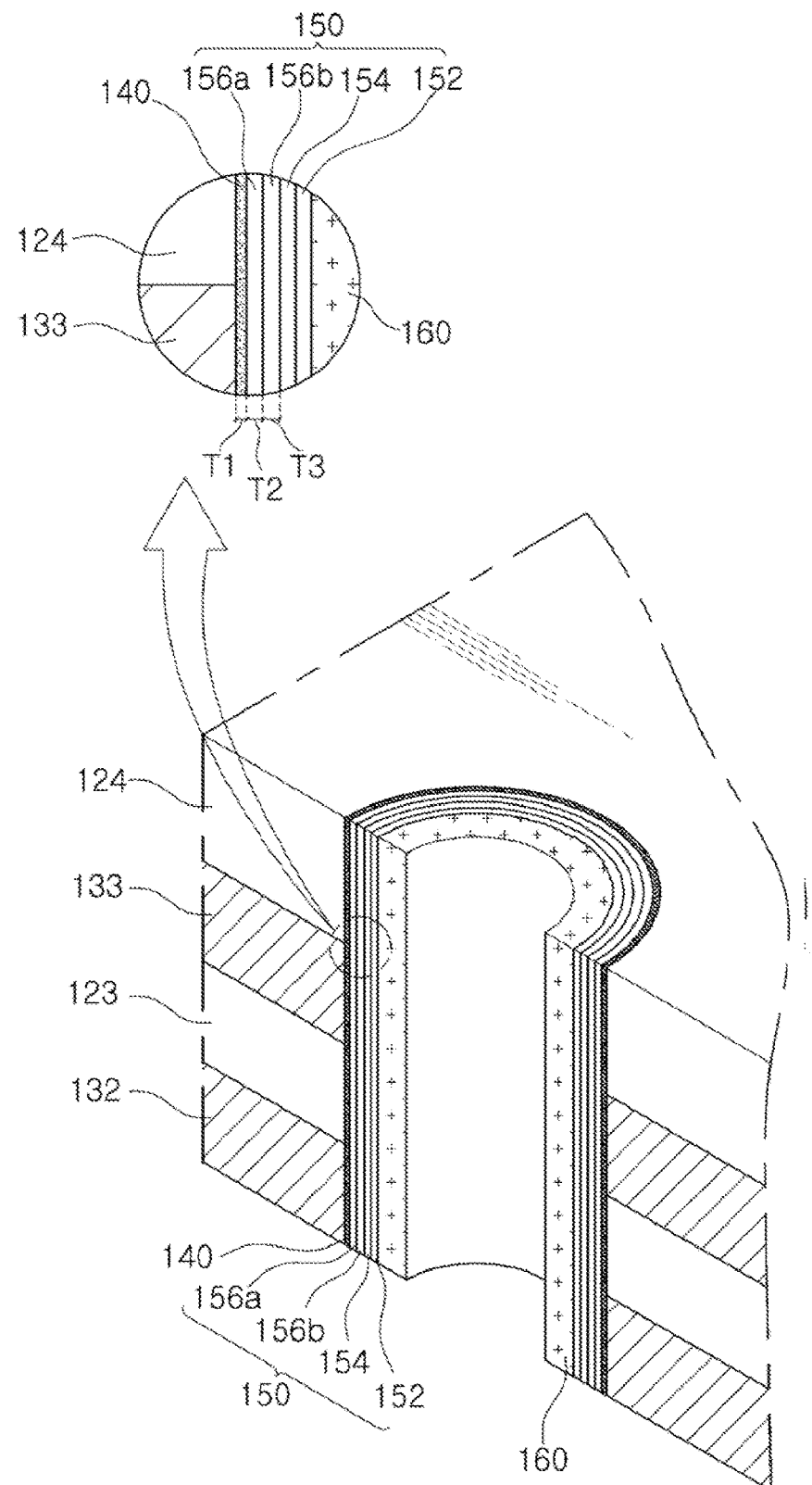
FIGS. 4 and 5 are partial perspective views illustrating gate dielectric layers and anti-oxidation layers according to exemplary embodiments of the present disclosure.
Figure 5:
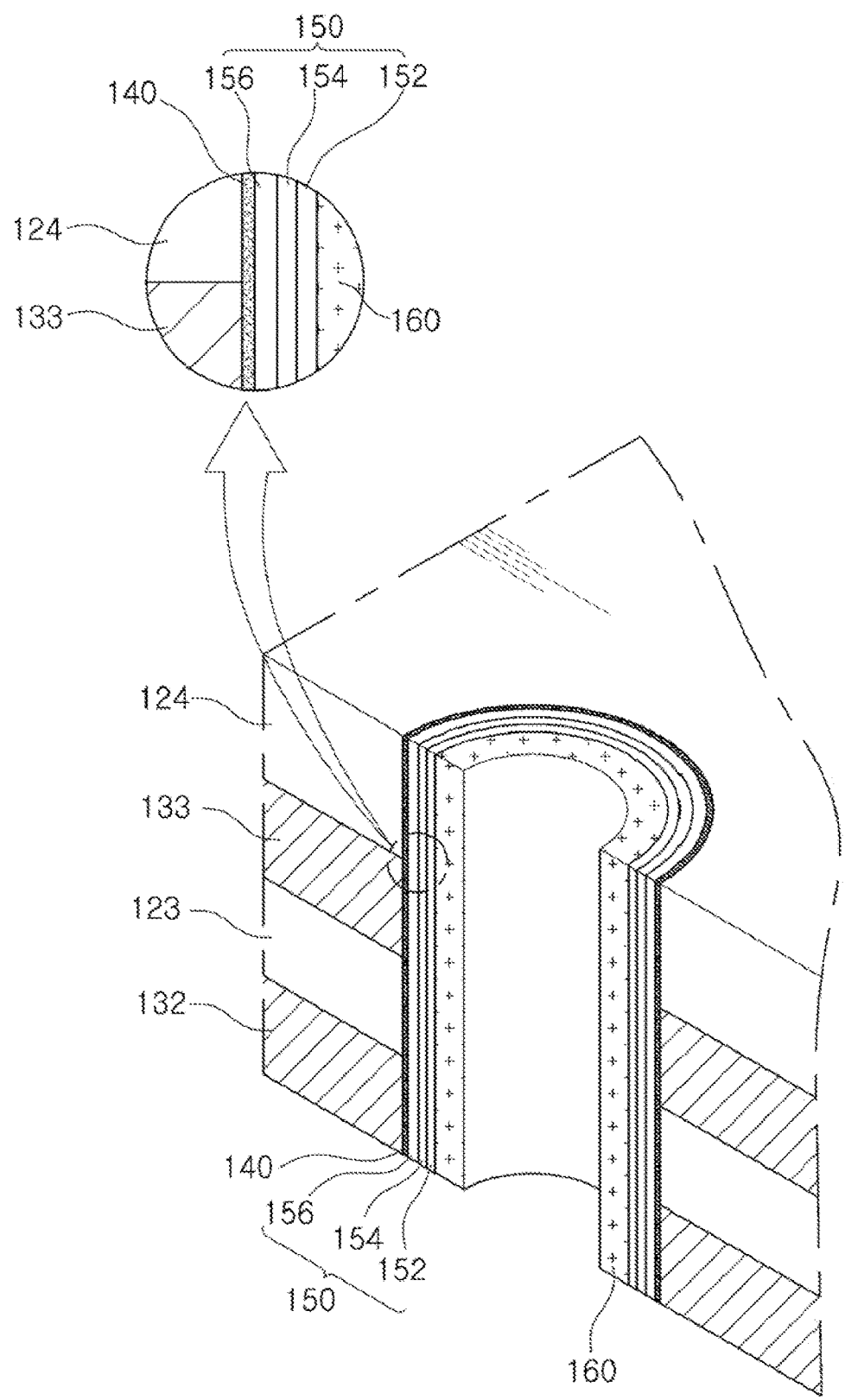

FIGS. 4 and 5 are enlarged partial perspective views of a portion A of FIG. 3 that illustrate example embodiments of the gate dielectric layer 150 and the anti-oxidation layer 140 of FIG. 3 in greater detail. In FIGS. 4 and 5, the buried insulating layer 175 of FIG. 3 is omitted from the illustration to better illustrate other elements of the device.

Referring to FIG. 4, the gate electrodes 132 and 133, the anti-oxidation layer 140, the gate dielectric layer 150, and the channel region 160 of a memory cell string are illustrated. The gate insulating layer 150 includes a tunneling layer 152, an electric charge storage layer 154, and blocking layers 156a and 156b, which are sequentially stacked on the channel region 160. Relative thicknesses of the layers forming the gate dielectric layer 150 are not limited to those illustrated in the drawing.

The tunneling layer 152 may include at least one of a silicon oxide ($SiO_2$), a silicon nitride ($Si_3N_4$), a silicon oxynitride (SiON), a hafnium oxide ($HfO_2$), a hafnium silicon oxide ($HfSi_xO_y$), an aluminum oxide ($Al_2O_3$), and a zirconium oxide ($ZrO_2$).

The electric charge storage layer 154 may be an electric charge trap layer or a floating gate conductive film. In the case in which the electric charge storage layer 154 is a floating gate conductive film, it may be formed by depositing polysilicon through low pressure chemical vapor deposition (LPCVD), for example. In the case in which the electric charge storage layer 154 is an electric charge trap layer, the electric charge trap layer may include at least one of a silicon oxide ($SiO_2$), a silicon nitride ($Si_3N_4$), a silicon oxynitride (SiON), a hafnium oxide ($HfO_2$), a zirconium oxide ($ZrO_2$), a tantalum oxide ($Ta_2O_3$), a titanium oxide ($TiO_2$), a hafnium aluminum oxide ($HfAl_xO_y$), a hafnium tantalum oxide ($HfTa_xO_y$), a hafnium silicon oxide ($HfSi_xO_y$), an aluminum nitride ($Al_xN_y$), and an aluminum gallium nitride ($AlGa_xN_y$).

The blocking layers 156a and 156b may include a high-k layer 156a and a low-k layer 156b. The low-k layer 156b may be contiguous with the electric charge storage layer 154. The blocking layers 156a and 156b may include a silicon oxide ($SiO_2$), a silicon nitride ($Si_3N_4$), a silicon oxynitride (SiON), or a high-k material. The high-k material may be any one of an aluminum oxide ($Al_2O_3$), a tantalum oxide ($Ta_2O_3$), a titanium oxide ($TiO_2$), an yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), and a praseodymium oxide ($Pr_2O_3$). The high-k layer 156a may be formed of a material having a high dielectric constant relative to the tunneling layer 152, and the low-k layer 156b may be formed of a material having a relatively small dielectric constant relative to the high-k layer 156a. By disposing the low-k layer 156b on the side of the high-k layer 156a, an energy band structure including barrier height may be adjusted to improve the characteristics such as, for example, the erase characteristics, of the non-volatile memory device.

The anti-oxidation layer 140 may be contiguous with the high-k layer 156a and the gate electrodes 132 and 133 and the interlayer insulating layers 123 and 124. The anti-oxidation layer 140 may be interposed between the high-k layer 156a on one side and the gate electrodes 132 and 133 and interlayer insulating layers 123 and 124 on the other side. The anti-oxidation layer 140 may include at least one of a silicon oxide ($SiO_2$), a silicon nitride ($Si_3N_4$), a silicon oxynitride (SiON), an aluminum oxide ($Al_2O_3$), a tantalum oxide ($Ta_2O_3$), a titanium oxide ($TiO_2$), an yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), and a praseodymium oxide ($Pr_2O_3$). In an exemplary embodiment, the anti-oxidation layer 140 may comprise a material that is different from that of the high-k layer 156a. For example, the anti-oxidation layer 140 may be formed of a material having a small dielectric constant relative to the high-k layer 156a, but the present disclosure is not limited thereto.

The anti-oxidation layer 140 may have a first thickness T1. Here, the first thickness T1 may be smaller than or equal to a second thickness T2 of the high-k layer 156a or smaller than a third thickness T3 of the low-k layer 156b, but the present disclosure is not limited thereto. The first thickness T1 of the anti-oxidation layer 140 may be within a range in which the anti-oxidation layer 140 does not inhibit the role of at least the blocking layers 156a and 156b in consideration of the second thickness T2, the third thickness T3, and the dielectric constants of the respective layers.

Referring to FIG. 5, an alternative exemplary embodiment is disclosed which is different from the exemplary embodiment of FIG. 4 in that the blocking layer 156 is configured as a single layer. The blocking layer 156 may include at least one of a silicon oxide ($SiO_2$), a silicon nitride ($Si_3N_4$), a silicon oxynitride (SiON), and a high-k dielectric material, and may be formed of a material having high-k relative to the tunneling layer 152.

Figure 6:
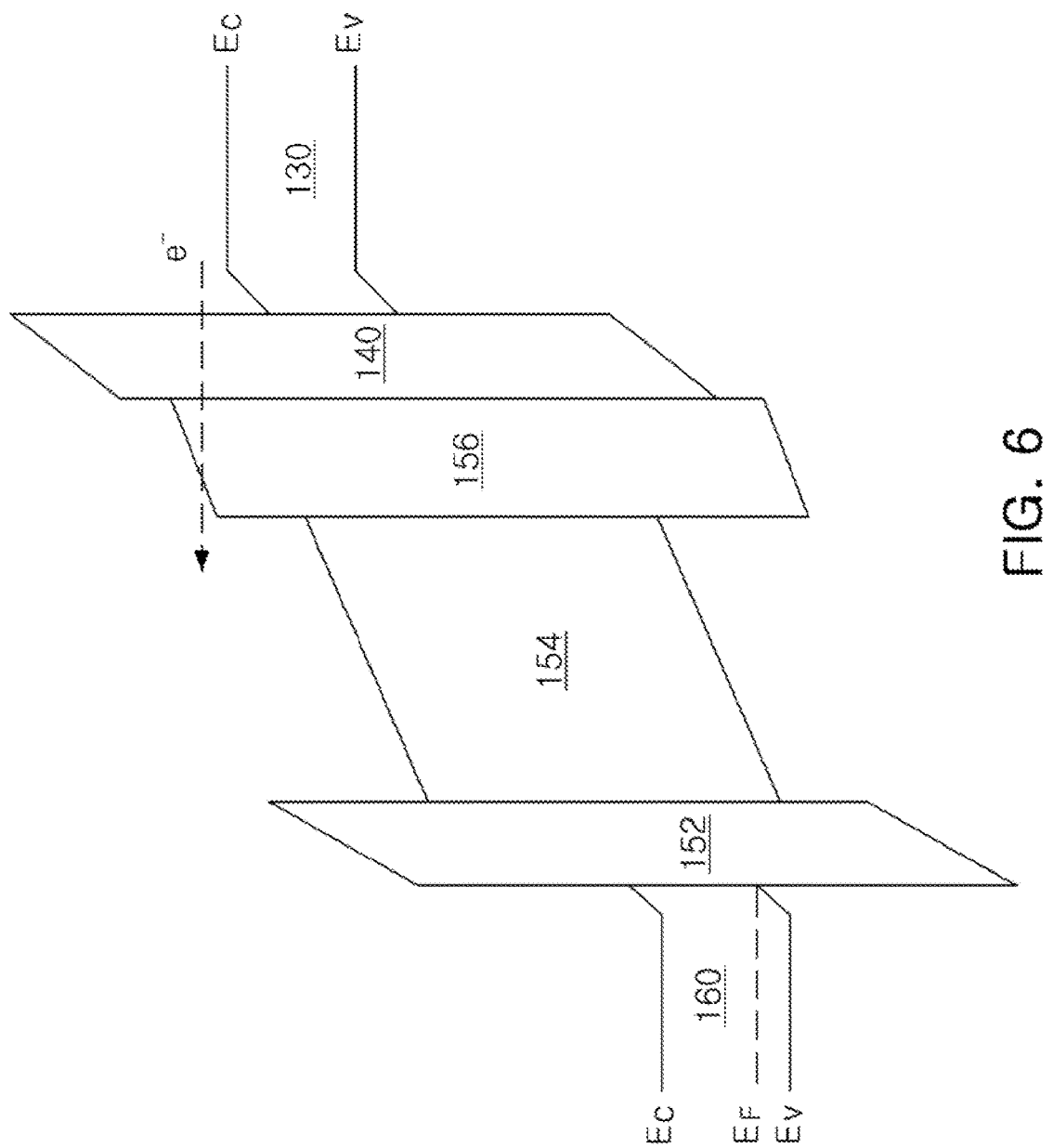
FIG. 6 is a band diagram illustrating an erase operation in a memory cell according to an exemplary embodiment of the present disclosure.

FIG. 6 is a band diagram illustrating an erase operation of a memory cell according to an exemplary embodiment of the present disclosure.

Referring to FIG. 6, illustrated from the left are the channel region 160, the gate dielectric layers 152, 154, and 156 (150), the anti-oxidation layer 140, and the gate electrode 130. In the present exemplary embodiment, a specific case is illustrated in which the gate dielectric layer 150 has the structure described above with reference to FIG. 5 and in which the blocking layer 156 of the gate dielectric layer 150 is formed of a high-k material and the anti-oxidation layer 140 is formed of a low-k material relative to the blocking layer 156. In the drawings, the thicknesses of the respective regions and band offsets between the regions are merely illustrative.

In the example of FIG. 6, the electric field that is generated in the high-k blocking layer 156 when a voltage is applied to the memory cell is reduced in proportion to dielectric constant. Thus, when a high voltage is applied to the channel region 160 to perform an erase operation, back tunneling of electrons coming from the gate electrode 130 may be reduced. However, if a portion of the gate electrode 130 is oxidized during the manufacturing process used to form the blocking layer 156, the unintentionally formed oxide film may not have a uniform thickness within a single memory cell string and/or within the entire memory cell array, thereby increasing the distribution of operational voltages, operational speeds, and the like, of the memory cells during device operation.

In the present exemplary embodiment, since the anti-oxidation layer 140 covering the gate electrodes 130 is uniformly formed within the entire memory cell array, formation of a non-uniform oxide film may be avoided, and hence the driving variables of the memory device may be more easily adjusted and the operational characteristics of the memory device may be improved. Also, by changing a thickness and permittivity of the anti-oxidation layer 140, the anti-oxidation layer 140 may also be used to adjust an energy band between the gate electrodes 130 and the gate dielectric layer 150.

FIGS. 7 through 14 are views schematically illustrating various processes of a method for manufacturing a non-volatile memory device according to an exemplary embodiment of the present disclosure. In FIGS. 7 through 14, the same reference numerals as those of FIGS. 3 through 5 denote the same elements, and thus, repeated descriptions of these elements will be omitted.

Figure 7:
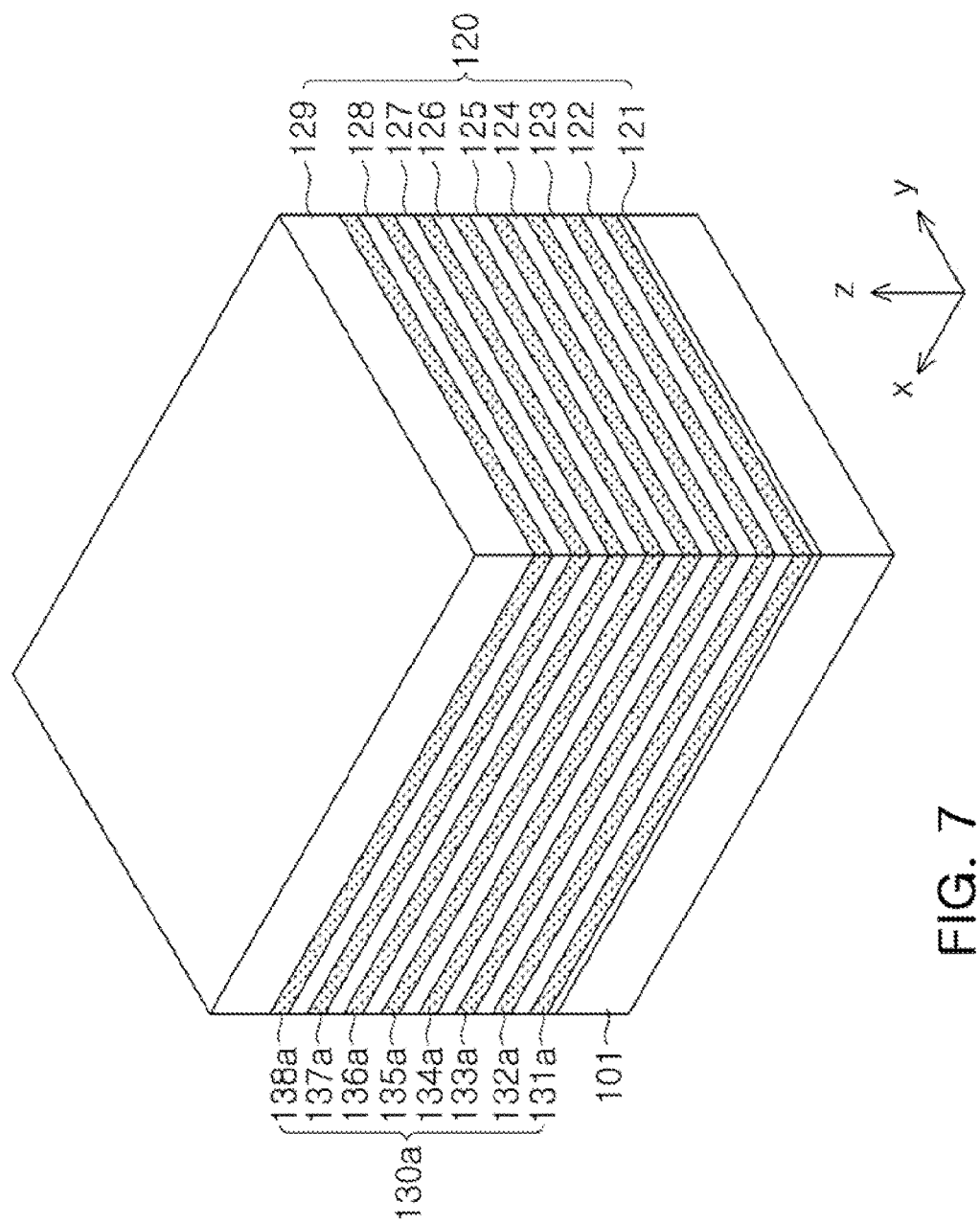
FIGS. 7 through 14 are perspective views schematically illustrating various processes of a method for manufacturing a non-volatile memory device according to an exemplary embodiment of the present disclosure.

Referring to FIG. 7, a plurality of interlayer insulating layers 121 to 129 (120) and a plurality of conductive layers 131a to 138a (130a) may be alternately stacked on the substrate 101. As illustrated, the interlayer insulating layers 120 and the conductive layers 130a may be alternately stacked on the substrate 101, starting from a first interlayer insulating layer 121. In this process, unlike the gate electrodes 130 of FIG. 3, the conductive layers 130a may be formed of polysilicon prior to formation of metal silicide. The interlayer insulating layers 120 may be, for example, at least one of silicon oxide films and silicon nitride films.

As illustrated, in the present exemplary embodiment, the thicknesses of the interlayer insulating layers 120 may not be uniform. For example, the lowermost interlayer insulating layer 121 (i.e., the layer that directly contacts the substrate 101) may be relatively thin, and the uppermost interlayer insulating layer 129 may be relatively thick.

However, thicknesses of the interlayer insulating layers 120 and the conductive layers 130a may be modified from those illustrated, and the number of films constituting the interlayer insulating layers 120 and the conductive layers 130a may also be modified.

Figure 8:
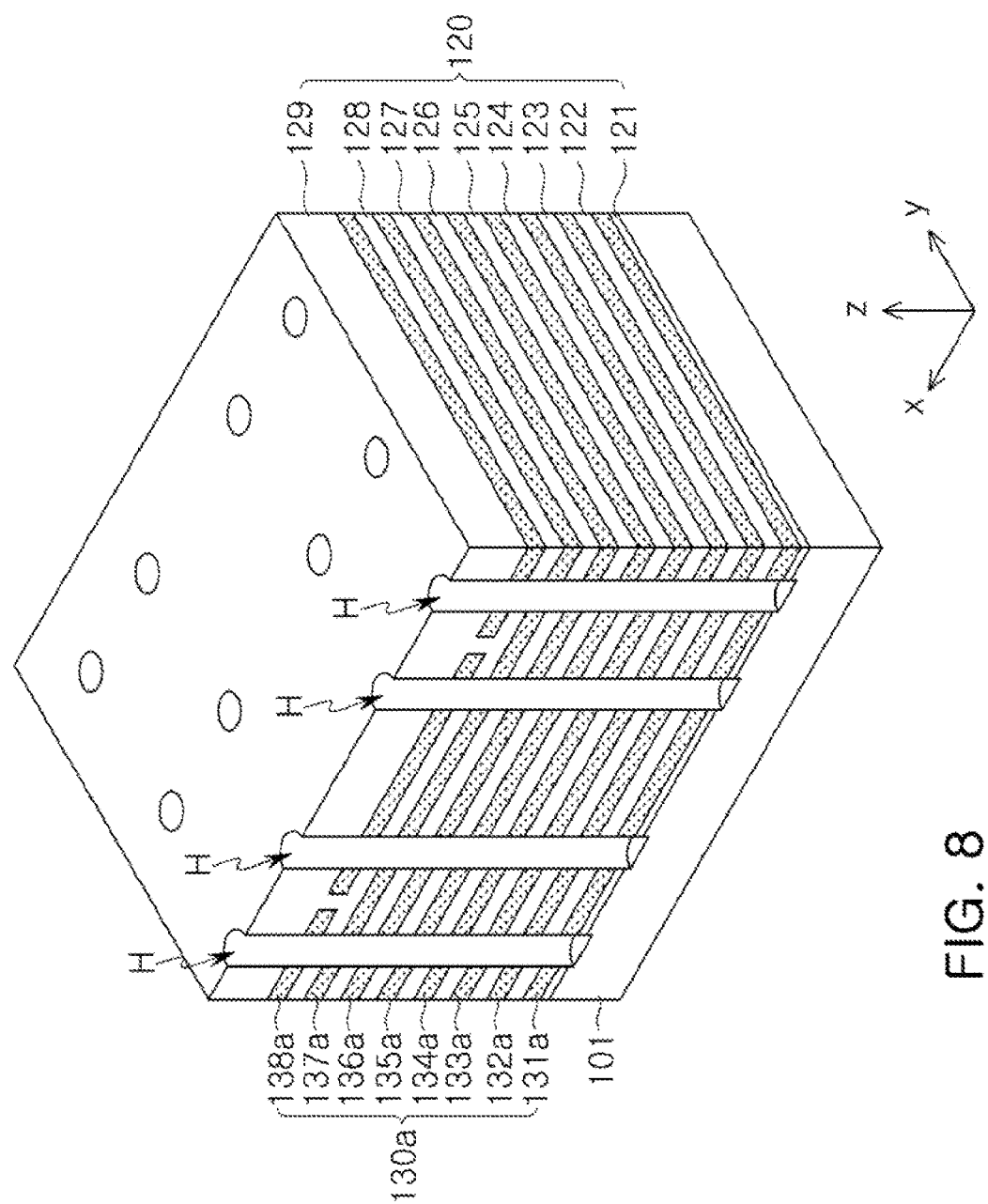

Referring to FIG. 8, openings H may be formed that penetrate the alternately stacked interlayer insulating layers 120 and conductive layers 130a. The openings H may extend to the substrate 101 in the z direction. As shown in FIG. 8, the openings may be spaced apart from one another in the x and y directions to provide an array of openings H that are arranged in columns and rows. The openings H may have a cylindrical or prismatic shape according to exemplary embodiments.

The openings H may be formed by forming a mask pattern that includes openings at the desired positions for the openings H on the alternately stacked interlayer insulating layers 120 and conductive layers 130a. The interlayer insulating layers 120 and the conductive layers 130a may then be anisotropically etched using the mask pattern as an etching mask. Since a stacked structure including two different types of layers is etched, side walls of the openings H may not be perpendicular to the upper surface of the substrate 101. For example, the widths of the bottom portions of the openings H (i.e., the portions close to the substrate 101) may be less than the widths of the top portions of the openings H (i.e., the portions that are farther from the substrate 101).

The openings H may expose the upper surface of the substrate 101 and, as illustrated, the openings H may be over-etched to recess the upper surface of the substrate 101 a predetermined amount.

Subsequently, a portion of the eighth conductive layer 138a may be removed in order to connect the eighth and ninth interlayer insulating layers 128 and 129. This process may be performed, for example, before the openings H are formed or before a separation opening C is formed as described hereinafter with reference to FIG. 12.

Figure 9:
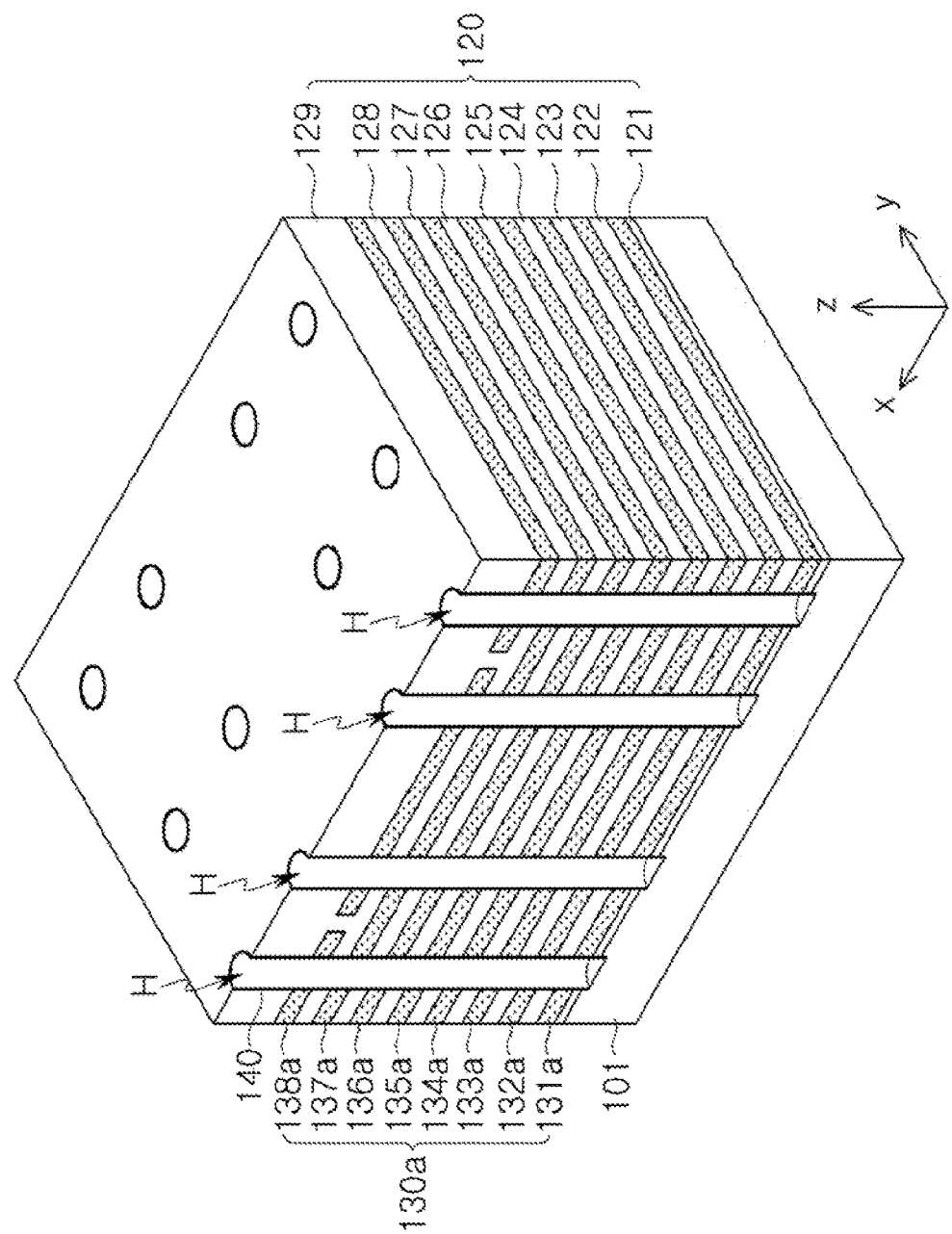

Referring to FIG. 9, anti-oxidation layers 140 may be formed in or on side walls of the openings H. The anti-oxidation layers 140 may be formed to have a uniform thickness by using atomic layer deposition (ALD) or chemical vapor deposition (CVD) as described above. The anti-oxidation layers 140 may be formed at a temperature at which the conductive layers 130a are not oxidized, or at a low temperature such as, for example, room temperature. The anti-oxidation layers 140 may be formed using a source gas which does not oxidize the conductive layers 130a.

Portions of the anti-oxidation layers 140 that are formed on the uppermost portion of the ninth interlayer insulating layer 129 and portions of the anti-oxidation layers 140 that are formed on the upper surface of the substrate 101 may be removed through a separate process. In some embodiments, this removal process may not be performed at this stage but performed together with a process of removing portions of the gate dielectric layers 150 in the same regions after the gate dielectric layers 150 are formed at a later stage.

Figure 10:
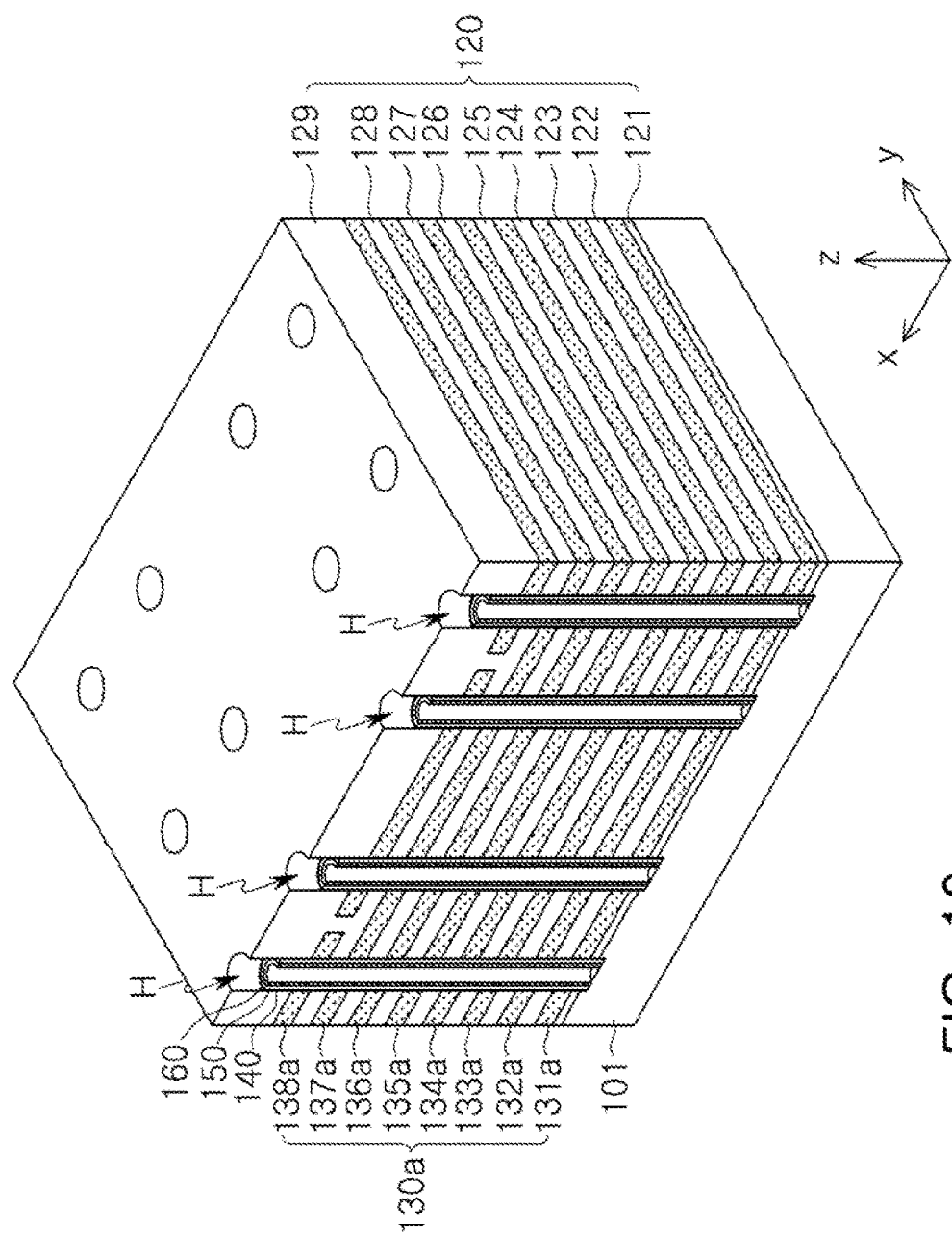

Referring to FIG. 10, the gate dielectric layers 150 and the channel region 160 may be formed on the anti-oxidation layers 140 within the openings H.

Each gate dielectric layer 150 may include the blocking layer 156, the electric charge storage layer 154, and the tunneling layer 152, which are sequentially stacked from the anti-oxidation layer 140, as described above with reference to FIGS. 4 and 5. For example, when the blocking layer 156 is an aluminum oxide ($Al_2O_3$) layer, an oxygen-containing gas such as, for example, an ozone ($O_3$) gas, may be used as an oxide source gas during the deposition process, and the ozone ($O_3$) gas may react with the conductive layers 130a to form an unintended oxide film on the exposed surfaces of the conductive layers 130a. However, according to the present exemplary embodiment, since the anti-oxidation layers 140 are formed on the conductive layers 130a before the blocking layers 156 are formed, formation of such an unintended oxide film may be prevented.

In forming the gate dielectric layers 150, layers formed on the upper surface of the substrate 101 in lower portions of the openings H may be removed by, for example, an etchback process to re-expose the substrate 101. Portions of the anti-oxidation layers 140 and the gate dielectric layers 150 formed in the upper regions of the openings H may also be removed, as shown in FIG. 10.

Thereafter, the channel regions 160 may be formed on the gate dielectric layers 150. The channel regions 160 may be in direct contact with the substrate 101 in the lower portion of each opening H. The channel region 160 material that is formed on the substrate 101 in the lower portions of the openings H may then be removed through an etchback process. The channel regions 160 may be partially removed in the upper portions of the openings H. The height of the channel regions 160 above the substrate 101 is not limited to the illustrated height, but instead may vary within a range. The height of the channel regions 160 will typically be higher than the top surface of the eighth conductive layer 138a.

Figure 11:
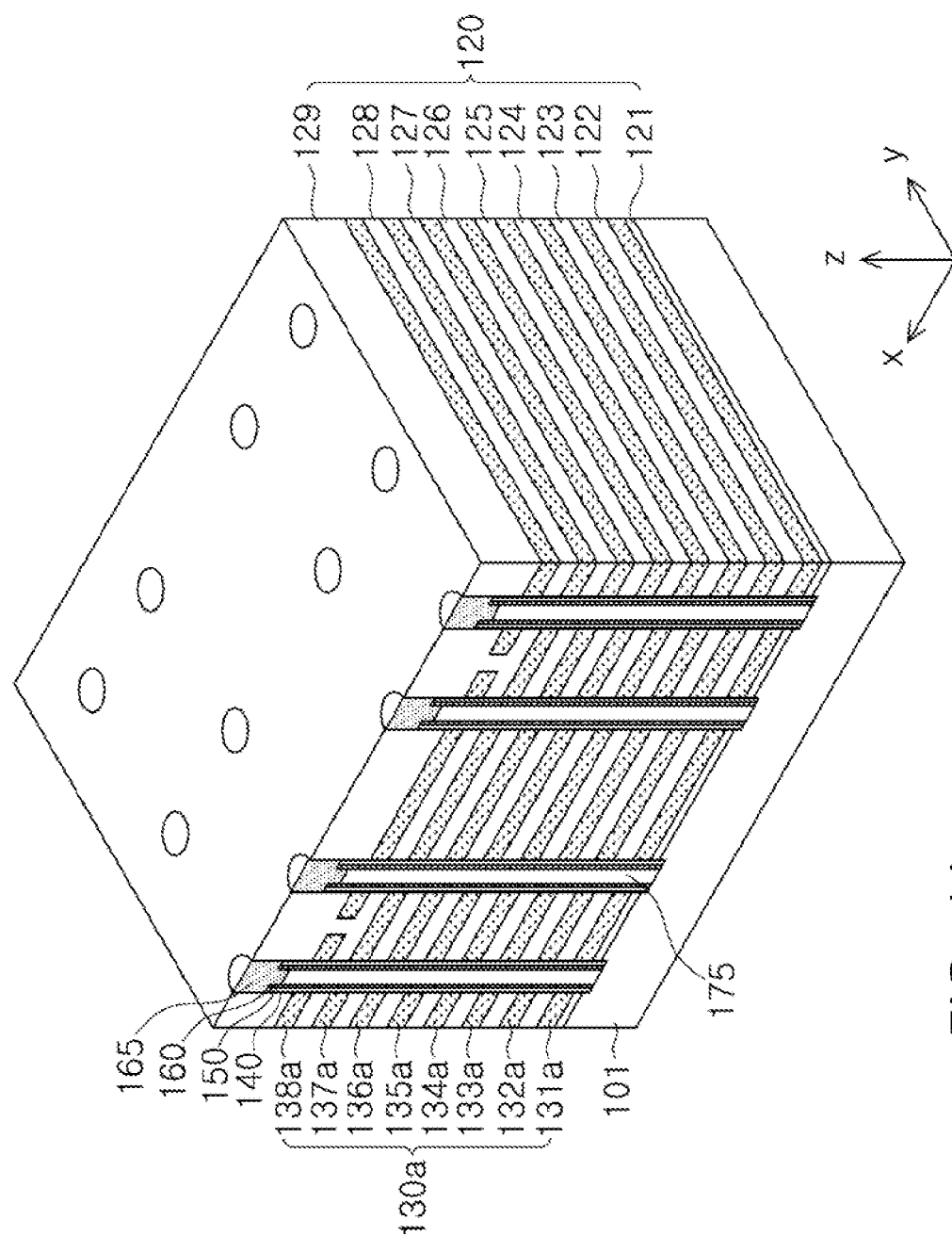

Referring to FIG. 11, buried insulating layers 175 may be formed that substantially fills the openings H up through the eighth conductive layer 138a and may also fill the openings H up through a portion of the ninth insulating layer 129. An etchback process may be performed after deposition of the buried insulating layer 175 material to etch away excess material so that a top surfaces of the buried insulating layers 175 are at a desired height above the substrate 101. Drain regions 165 may be formed on the buried insulating layers 175.

The drain regions 165 may be formed on the buried insulating layers 175 so that the drain regions 165 are connected to the channel region 160 material. After a conductive material for forming the drain region 165 is deposited on the upper surface of the buried insulating layers 175, a planarization process may be performed to remove the portions of this conductive material (not shown) that cover the upper surface of the ninth interlayer insulating layer 129. Accordingly, the drain regions 165 may be formed on the buried insulating layers 175 in the upper portions of the openings H. According to an exemplary embodiment, the drain regions 165 may be formed of the same material that is used to form the channel regions 160 and the drain regions 165 may be contiguous with the ninth interlayer insulating layer 129. The heights of the drain regions 165 is not limited to that illustrated and may vary according to an exemplary embodiment.

Figure 12:
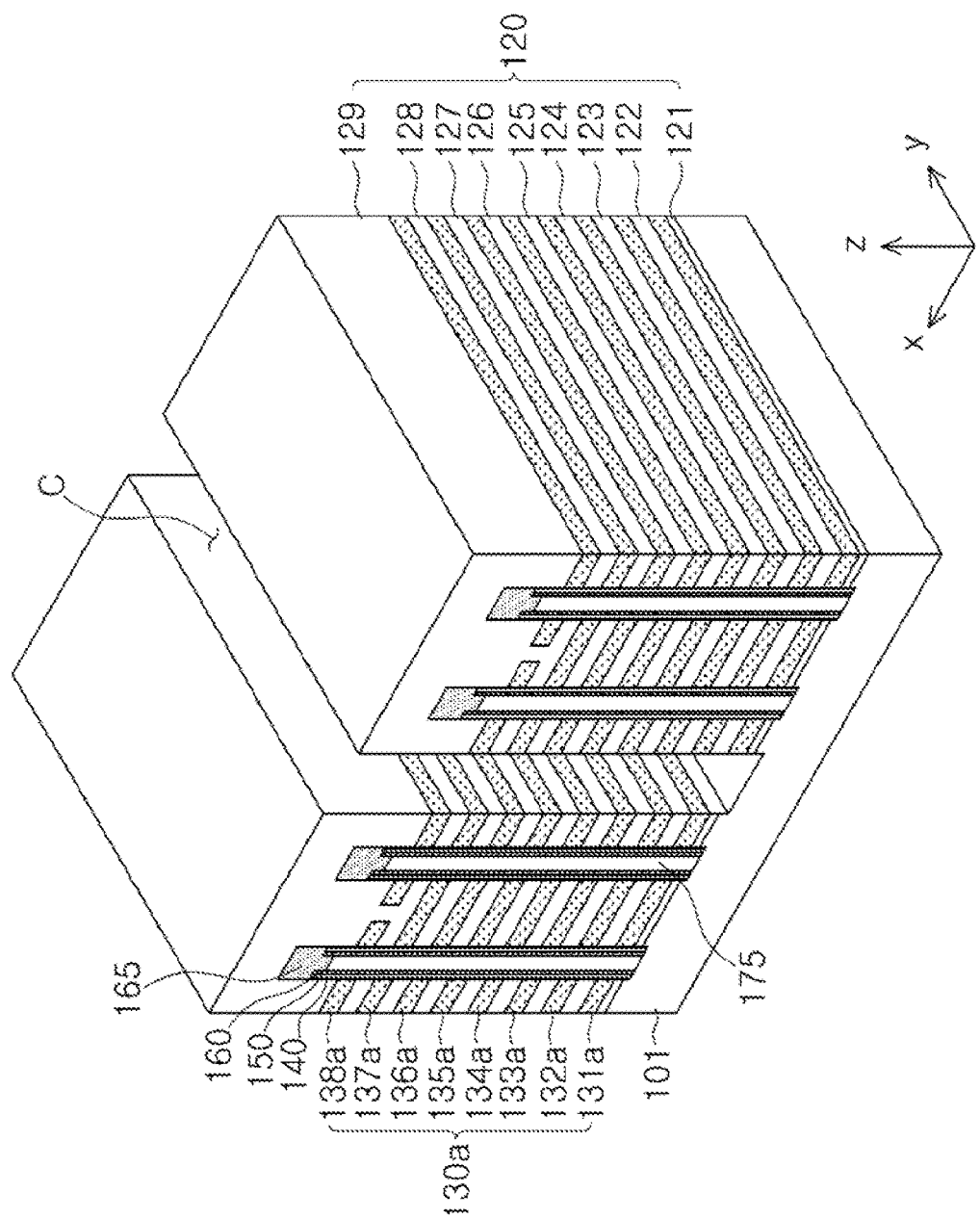

Referring to FIG. 12, a separation opening C may be formed to separate the conductive layers 130a by a predetermined interval and to expose the substrate 101 between the channel regions 160. The separation opening C may have a line shape that extends in the y direction, and at least one separation opening C may be formed in each channel region 160 in the x direction between the channel regions 160. Before the separation opening C is formed, an additional insulating layer may be formed on the ninth interlayer insulating layer 129 and on the drain regions 165 in order to increase a thickness of the ninth interlayer insulating layer 129. The provision of this additional insulating layer may help reduce or prevent damage to the drain regions 165 and the channel regions 160 therebelow during formation of the separation opening C.

The separation opening C may be formed by forming a mask layer using a photolithography process and then anisotropically etching the interlayer insulating layers 120 and the conductive layers 130a. A source region 105 constituting the common source line CSL (please refer to FIG. 2) is formed in the portion of the substrate 101 exposed by the separation opening C in a follow-up process.

Figure 13:
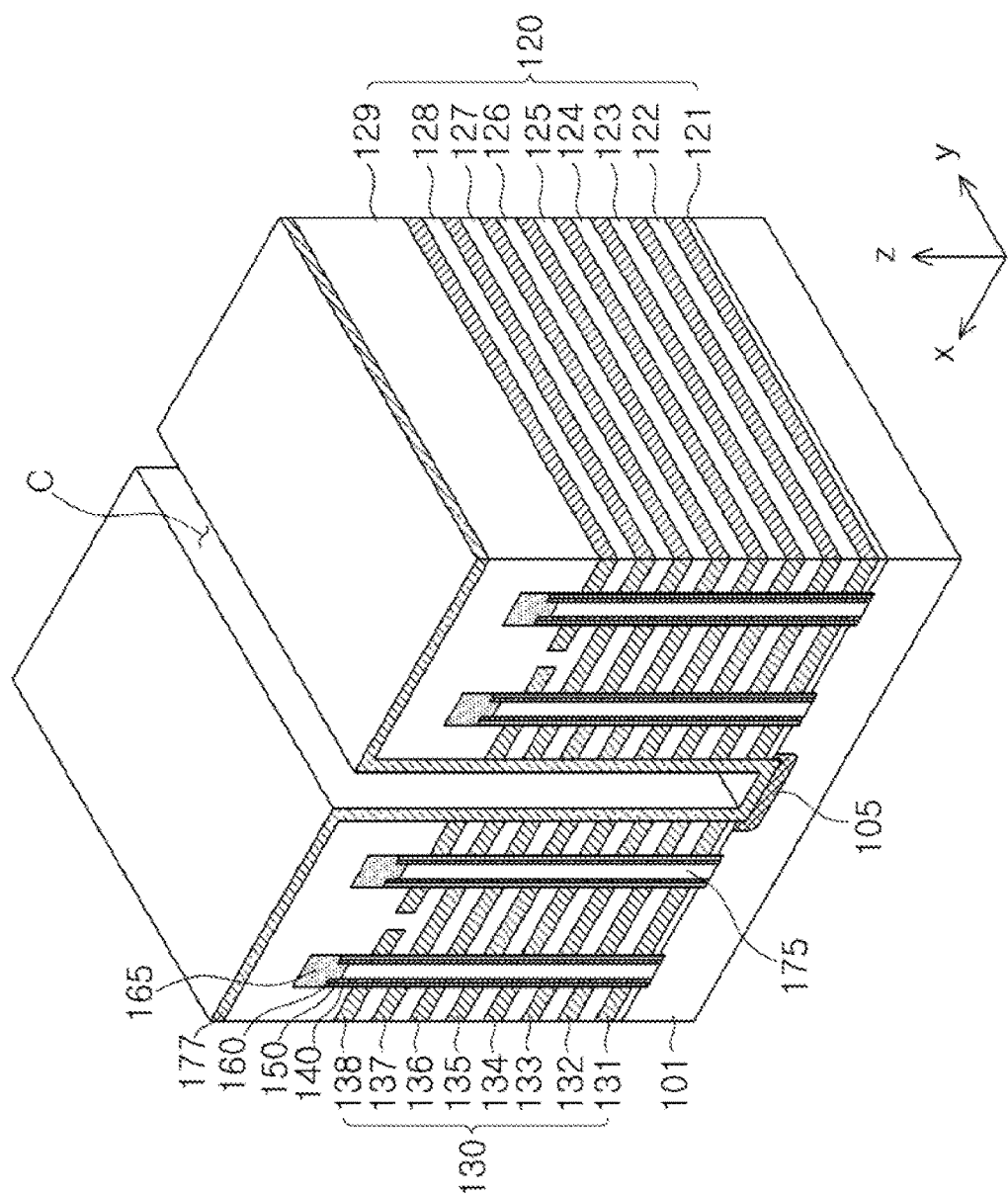

Referring to FIG. 13, a metal layer 177 may be formed within the separation opening C. The metal layer 177 may be used to convert exposed portions of the polysilicon conductive layers 130a into metal silicide. After the metal layer 177 is formed, a heat treatment process may be performed to allow metals of the metal layer 177 to spread to convert the polysilicon conductive layers 130a into silicide such that the gate electrode 130 is formed, thereby reducing resistance. Thereafter, the remaining metal of metal layer 177 may be removed.

In this process, the portion of the substrate 101 that is exposed in the lower portion of the separation opening C may also be converted into a silicide to a predetermined depth. This silicide portion of the substrate 101 may form the source region 105. In an exemplary embodiment, an ion implantation process may be additionally performed to form a doped region around the silicide source region 105. Also, in a modified embodiment, the source region 105 may be formed as a doped region to form a PN junction with the underlying substrate 101 region through ion implantation instead of forming a silicide source region. In this case, the source region 105 may be configured to include a high concentration doped region with low concentration doped regions disposed at both ends thereof.

Figure 14:
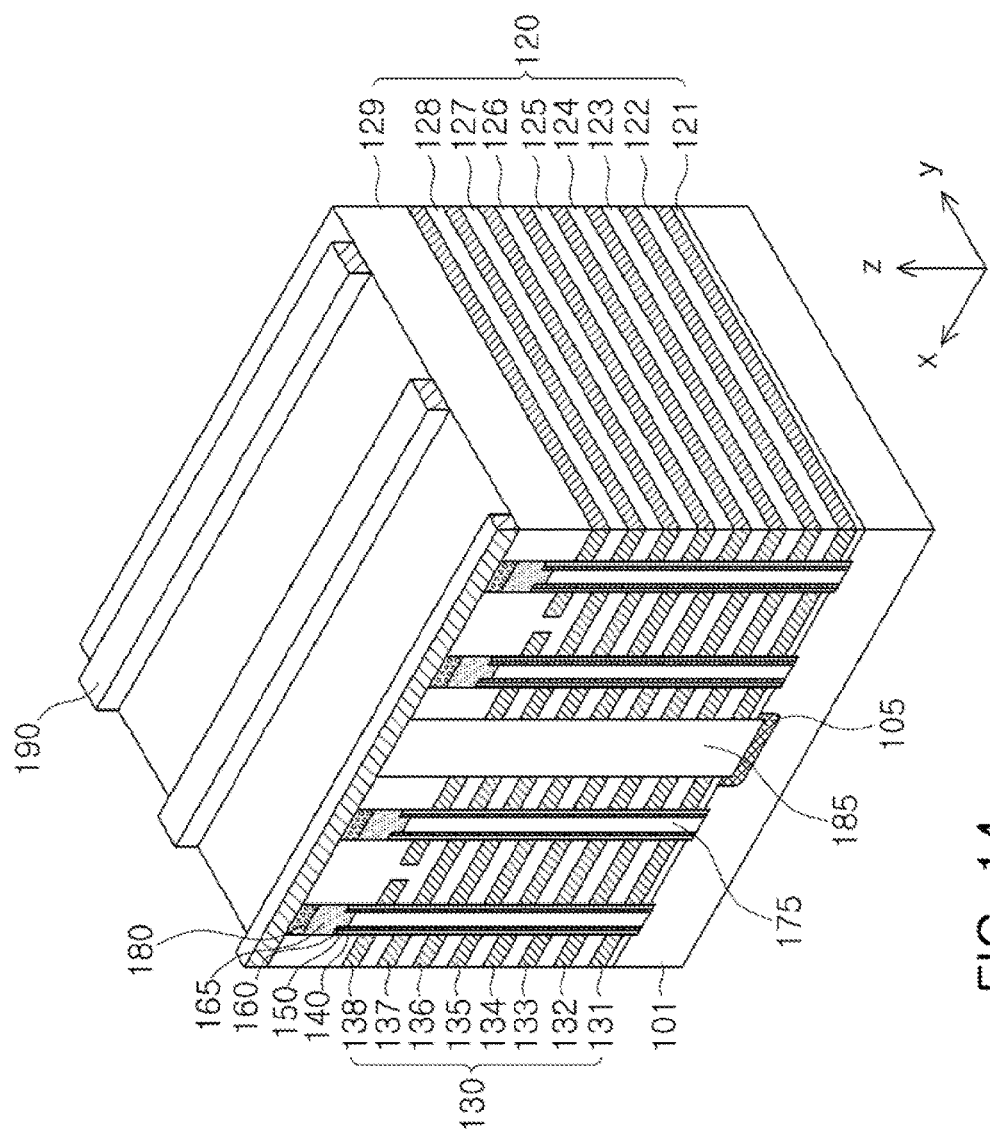

Referring to FIG. 14, a separation insulating layer 185 may be formed on the source region 105 in the separation opening C, and contact plugs 180 that are connected to the drain regions 165 may be formed on the drain regions 165. Bit lines 190 may then be formed on the contact plugs 180 and on the top surface of the ninth interlayer insulating layer 129. The bit lines 190 may extend in the x-direction and be spaced-apart from each other in the y-direction.

The contact plugs 180 may be formed of a conductive material and may be connected to the respective drain regions 165. The contact plugs 180 may be formed in upper portions of the openings H. In other embodiments, the contact plugs 180 may be omitted or may be integrated with the drain regions 165.

Each bit line 190 may be formed on the ninth interlayer insulating layer 129 and connects to a column of drain regions 165 and contact plugs 180 that are arranged in the x direction. The bit lines 190 may be formed in a line shape through a conductive material deposition process, a mask forming process, and an etching process based on photolithography.

Figure 15:
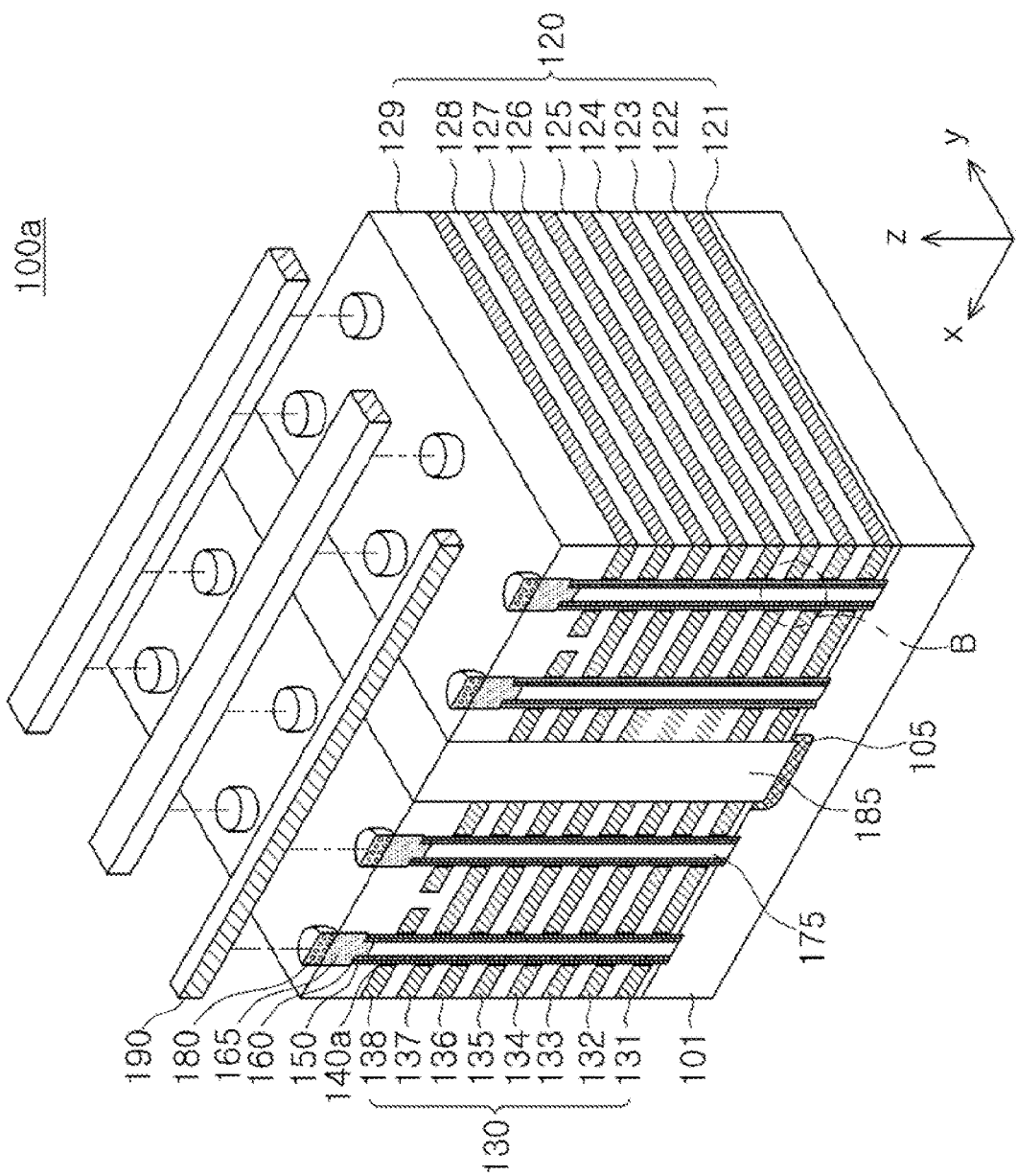
FIG. 15 is an exploded perspective view schematically illustrating a structure of memory cell strings of a non-volatile memory device according to an exemplary embodiment of the present disclosure.

FIG. 15 is an exploded perspective view schematically illustrating a structure of memory cell strings of the non-volatile memory device according to an exemplary embodiment of the present disclosure.

Referring to FIG. 15, a non-volatile memory device 100a may include channel regions 160 that are disposed in a direction perpendicular to the upper surface of the substrate 101, and a plurality of interlayer insulating layers 120 and a plurality of gate electrodes 130 stacked along outer side walls of the channel region 160. The non-volatile memory device 100a may further include anti-oxidation layers 140a and a gate dielectric layers 150 that are disposed between the gate electrodes 130 and the channel regions 160, and may include bit lines 190 that are disposed on upper portions of the channel regions 160.

The anti-oxidation layers 140a may be positioned between the gate electrodes 130 and the gate dielectric layers 150, and may be contiguous with lateral surfaces of the gate electrodes 130 that face the channel regions 160. The anti-oxidation layers 140a may serve to protect the gate electrodes 130 from being oxidized during a manufacturing process.

Figure 16:
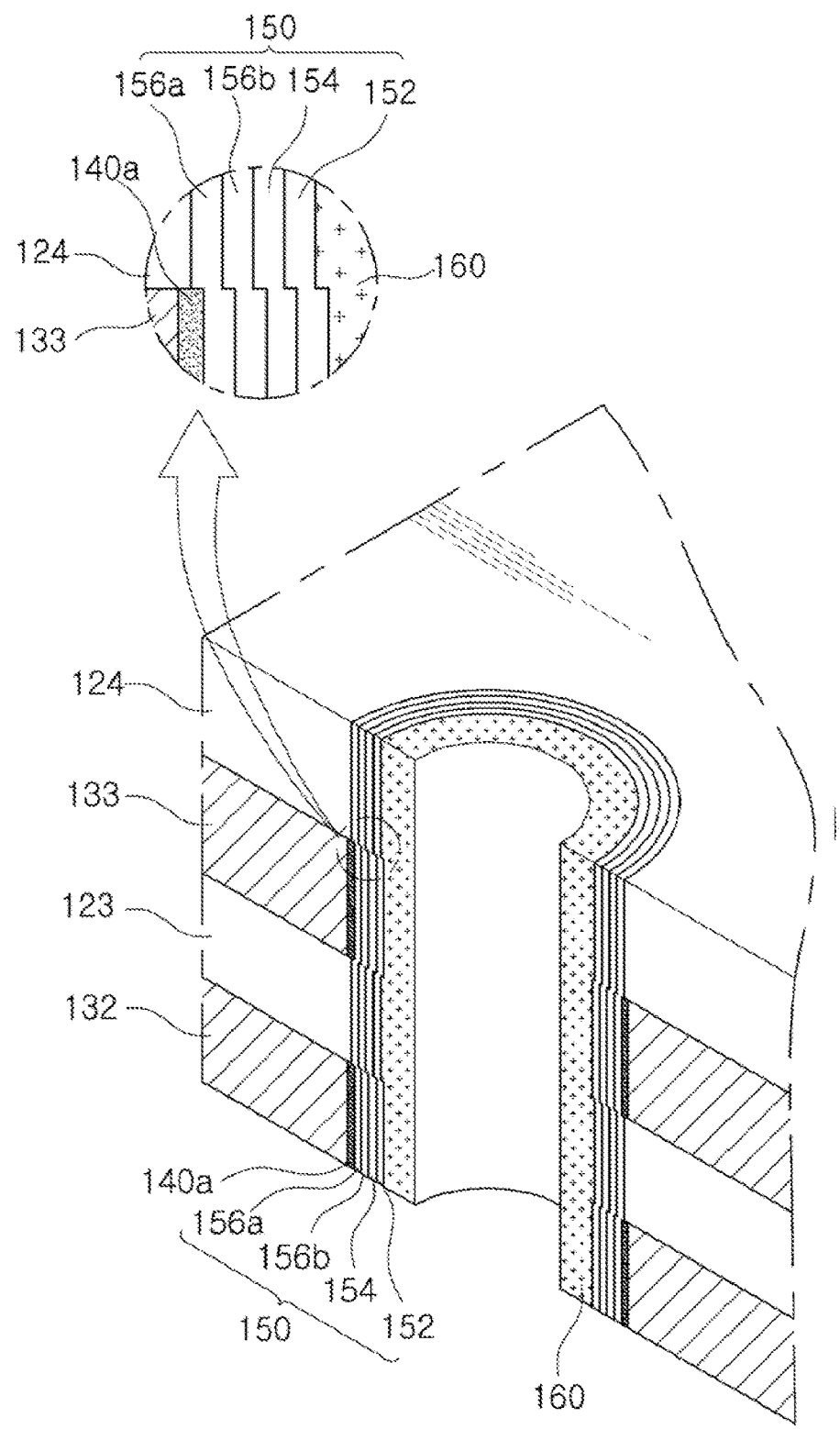
FIGS. 16 and 17 are partial perspective views illustrating gate dielectric layers and anti-oxidation layers according to exemplary embodiments of the present disclosure.
Figure 17:
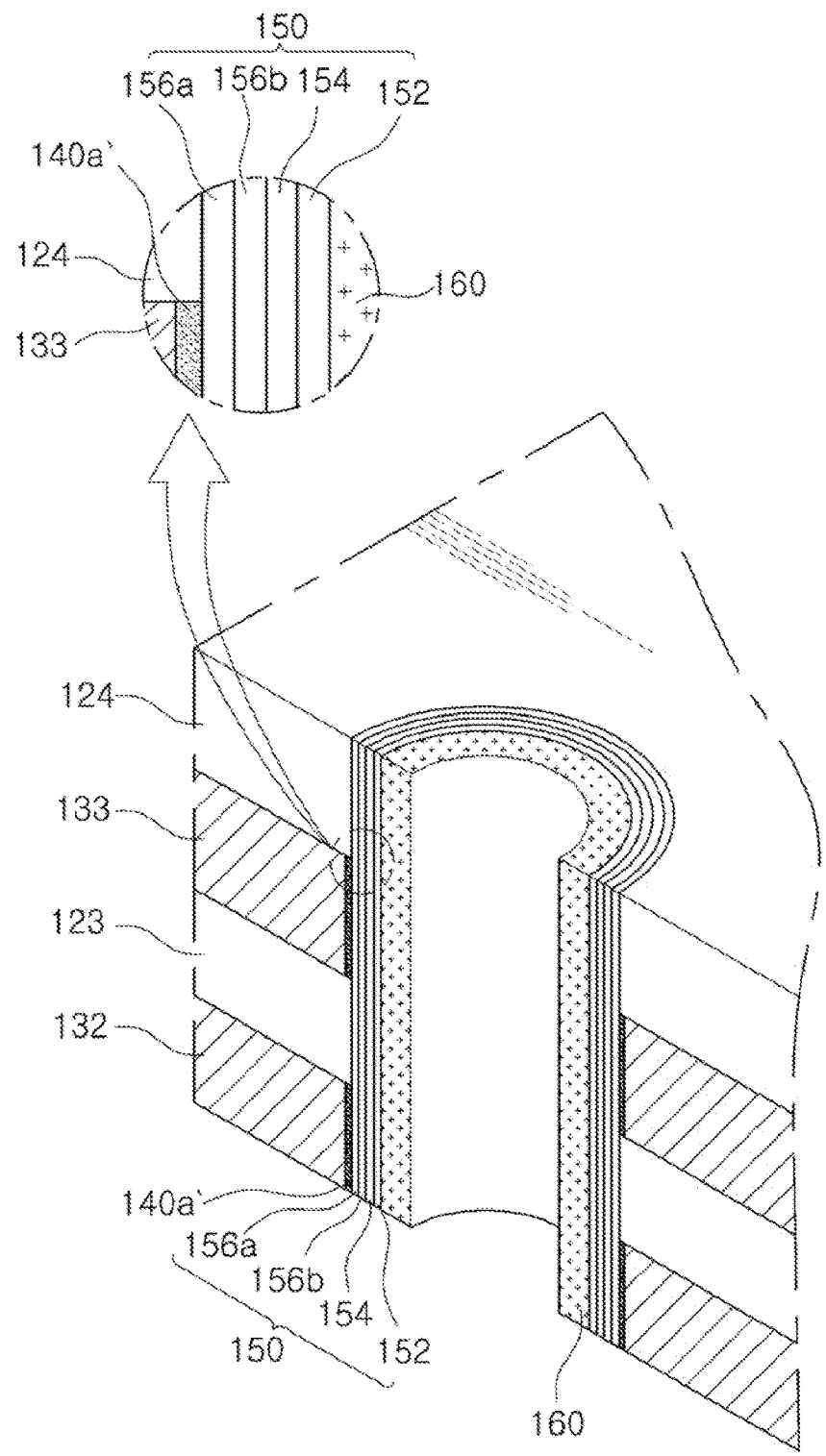

The anti-oxidation layers 140a of FIG. 15 differ from the anti-oxidation layers 140 of FIG. 3 in that the anti-oxidation layers 140a are only disposed on the lateral surfaces of the gate electrodes 130 and do not extend to the interlayer insulating layers 120 along the channel regions 160, as can more clearly be seen in FIGS. 16 and 17. The anti-oxidation layers 140a may have a substantially uniform thickness on the lateral surfaces of the gate electrodes 130. The anti-oxidation layers 140a may include a dielectric material and may formed of, for example, a dielectric material different from that of the blocking layer of the gate dielectric layers 150.

FIGS. 16 and 17 are enlarged partial perspective views of a portion B of FIG. 15 that illustrate the gate dielectric layers 150 and the anti-oxidation layers 140a, 140a' that may be used in the exemplary embodiment of FIG. 15. In FIGS. 16 and 17, the buried insulating layer 175 of FIG. 15 is omitted to more clearly illustrate other elements of the device.

Referring to FIGS. 16 and 17, the gate electrodes 132 and 133, the anti-oxidation layers 140a and 140a', the gate dielectric layer 150, and the channel region 160 of a portion of a memory cell string are illustrated. The gate dielectric layer 150 includes a tunneling layer 152, an electric charge storage layer 154, and blocking layers 156a and 156b that are sequentially stacked on the channel region 160.

The anti-oxidation layers 140a and 140a' may be between the high-k layer 156a and the gate electrodes 132 and 133, and may be in direct contact with the high-k layer 156a and the gate electrodes 132 and 133. The anti-oxidation layers 140a and 140a' may not extend along the lateral surfaces of the interlayer insulating layers 123 and 124. The anti-oxidation layers 140a and 140a' may be formed by oxidizing portions of conductive layers that constitute the gate electrodes 132 and 133.

In the exemplary embodiment of FIG. 16, the anti-oxidation layer 140a may be formed to protrude laterally in both directions, namely both toward the gate electrodes 132 and 133 and toward the channel region 160 as viewed with respect to the boundary where the interlayer insulating layers 123 and 124 contact the blocking layer 156a. This can best be seen in the callout in FIG. 16. Thus, as shown in the callout, in a direction in which the channel region 160 extends, the anti-oxidation layer 140a may protrude inwardly from the boundary with the interlayer insulating layers 123 and 124, relative to the interlayer insulating layers 123 and 124 so that the blocking layers 156a, 156b, the electric charge storage layer 154, the tunneling layer 152 and the channel region 160 all jog inwardly at each of the gate electrodes 130.

In another exemplary embodiment (not shown), the anti-oxidation layer 140a may only protrude in the direction toward the channel region 160 relative to the boundary surface in which the interlayer insulating layers 123 are contiguous with the blocking layers 156a and 156b. In this case, the lateral surface of the anti-oxidation layer 140a that contacts the gate electrodes 132 and 133 may be positioned to be coplanar with the lateral surfaces of the interlayer insulating layers 123 and 124.

FIG. 17 illustrates yet another exemplary embodiment in which an anti-oxidation layer 140a' is provided that has a lateral surface which is opposite the gate electrodes 132, 133 that is coplanar with the boundary between the interlayer insulating layers 123 and 124 and the blocking layer 156a.

Figure 18:
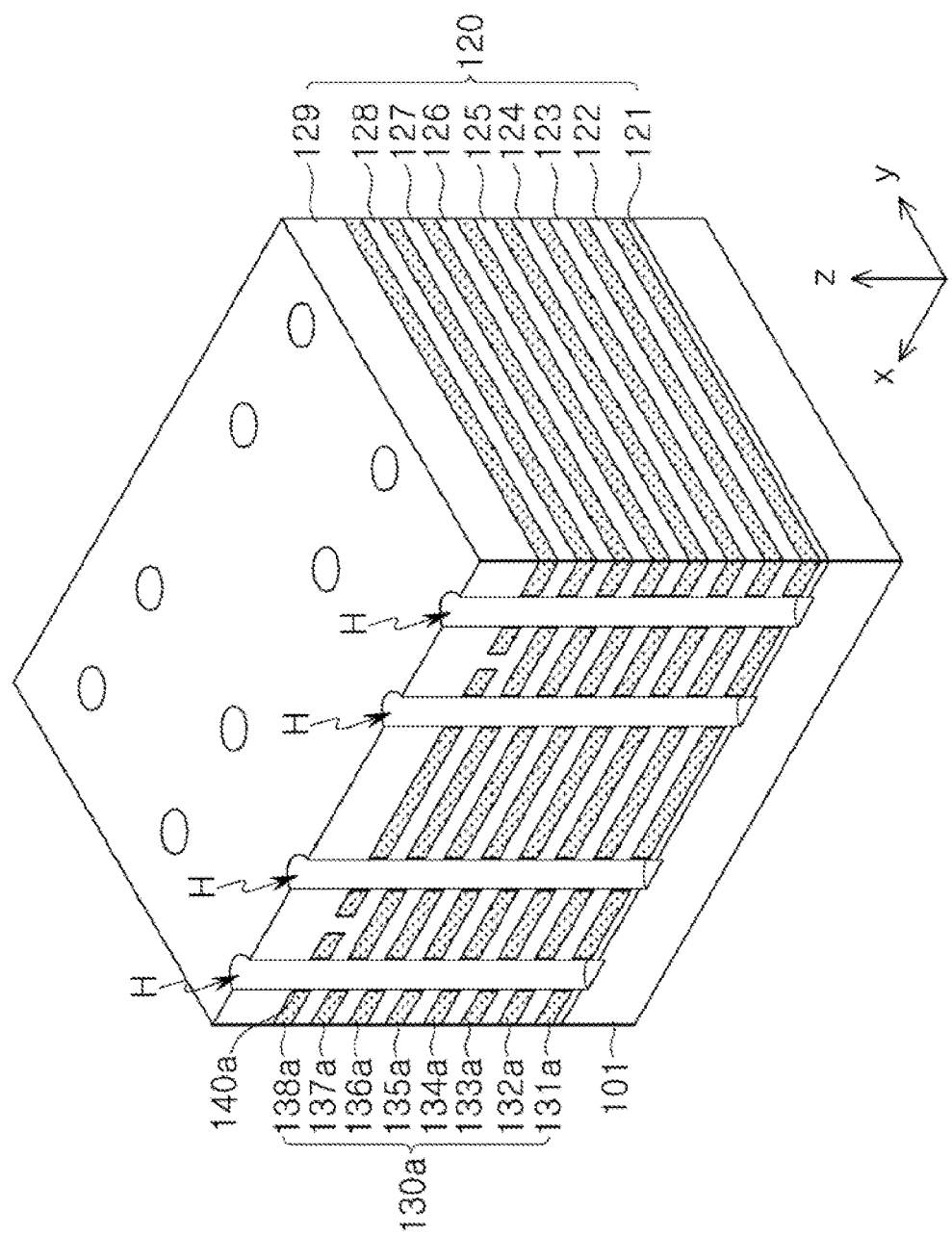
FIGS. 18 and 19 are perspective views schematically illustrating various processes of a method for manufacturing a non-volatile memory device according to an exemplary embodiment of the present disclosure.
Figure 19:
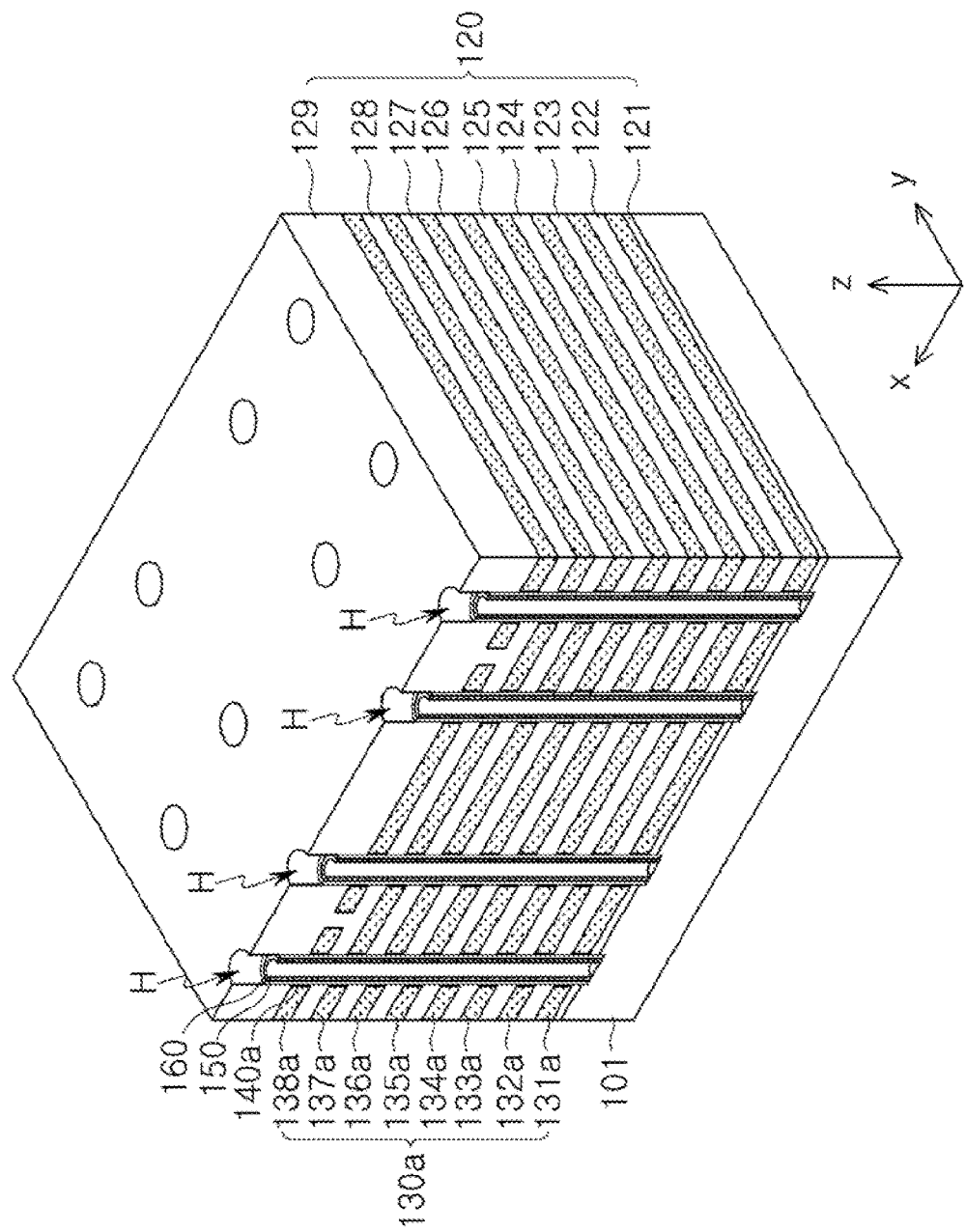

FIGS. 18 and 19 are perspective views that schematically illustrate various of the processes of a method for manufacturing a non-volatile memory device according to an exemplary embodiment of the present disclosure.

Referring to FIG. 18, first, after a plurality of interlayer insulating layers 120 and a plurality of conductive layers 130a are alternately stacked on the substrate 101, the openings H may be formed as described above with reference to FIGS. 7 and 8.

Next, the anti-oxidation layers 140a are formed on side walls of the openings H. The anti-oxidation layers 140a may be formed to have a uniform thickness on the side walls of the conductive layers 130a that are exposed through the openings H by using an oxidation process such as plasma oxidation, or the like, as described above. In this case, portions of the conductive layers 130a are oxidized to form the anti-oxidation layers 140a. Thus, as illustrated in FIG. 16, the anti-oxidation layers 140a may be formed in inner and outer sides of the conductive layers 130a by a predetermined length from the lateral surfaces of the initial conductive layers 130a within the openings H. Accordingly, the anti-oxidation layer 140a may be formed to protrude toward the openings H, relative to the interlayer insulating layers 120.

In the exemplary embodiment as described above with reference to FIG. 17, for example, portions of the anti-oxidation layer 140a that protrude toward the openings H may be removed by performing an additional process so that the lateral surfaces of the anti-oxidation layer 140a are coplanar with the lateral surfaces of the interlayer insulating layers 120.

Referring to FIG. 19, the gate dielectric layers 150 and the channel regions 160 are formed on the anti-oxidation layers 140a within the openings H. Each gate dielectric layer 150 may have a structure in which the blocking layer 156, the electric charge storage layer 154, and the tunneling layer 152 are sequentially stacked on the anti-oxidation layer 140a.

Thereafter, the foregoing processes as described above with reference to FIGS. 11 through 14 may be performed in the same manner to manufacture the non-volatile memory device 100a of FIG. 15.

Figure 20:
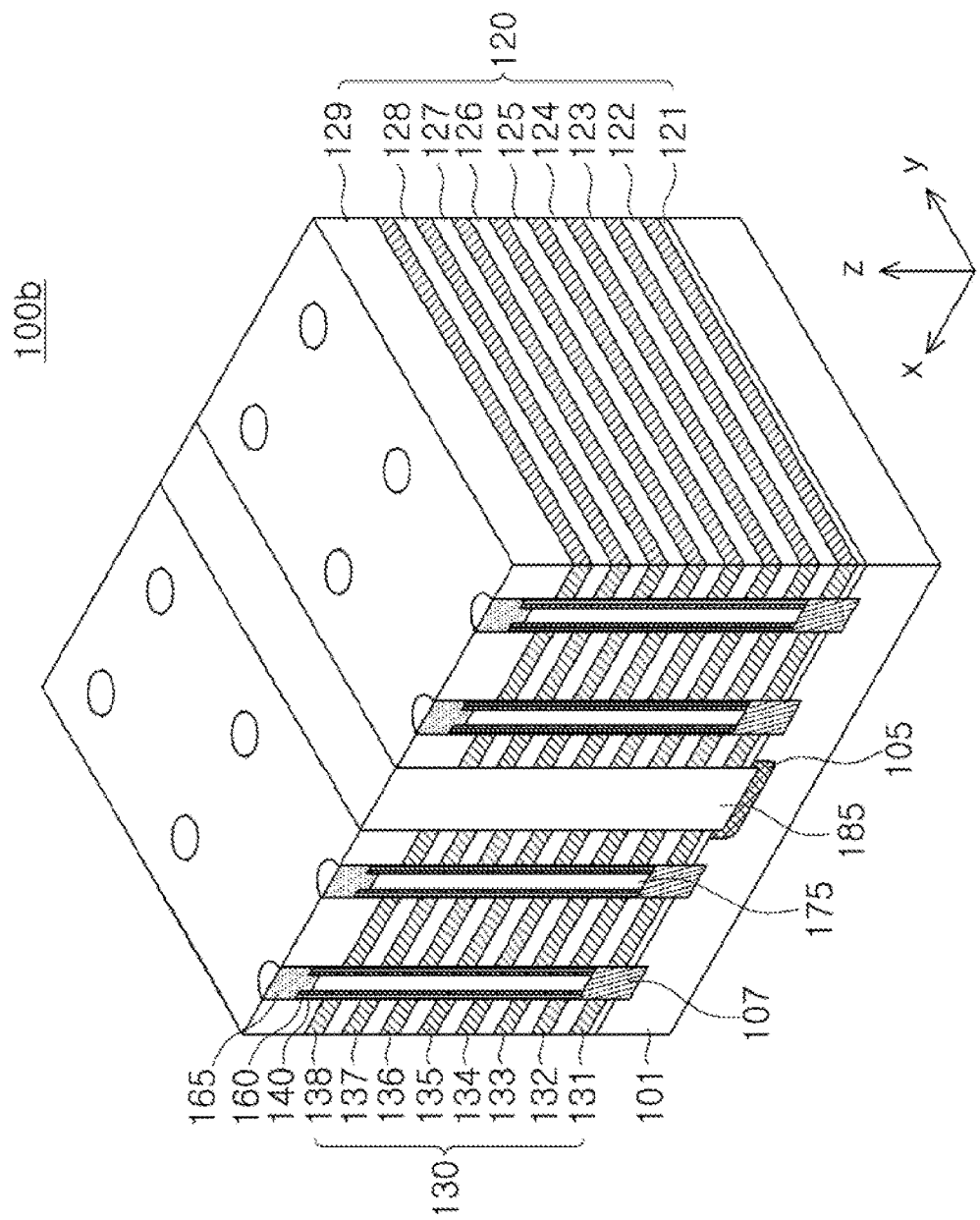
FIG. 20 is a perspective view schematically illustrating a structure of memory cell strings of a non-volatile memory device according to an exemplary embodiment of the present disclosure.

FIG. 20 is a perspective view schematically illustrating a structure of memory cell strings of a non-volatile memory device according to an exemplary embodiment of the present disclosure.

Referring to FIG. 20, a non-volatile memory device 100b may include channel regions 160 that are disposed perpendicularly on the substrate 101 and a plurality of interlayer insulating layers 120 and a plurality of gate electrodes 130 disposed on outer side walls of the channel regions 160. The non-volatile memory device 100b further includes the anti-oxidation layers 140 and the gate dielectric layers 150 disposed between the gate electrodes 130 and the channel regions 160. In the exemplary embodiment of FIG. 20, epitaxial layers 107 having a predetermined height may be formed on the substrate 101 in lower portions of the channel regions 160. In FIG. 20, some components of the non-volatile memory device 100b such as, for example, the bit lines 190, are omitted to simplify the drawing.

Upper surfaces of the epitaxial layers 107 may be higher above the top surface of the substrate 101 than is the top surface of the gate electrode 131 of the ground select transistor GST. For example, the top surfaces of the epitaxial layers 107 may be coplanar with a portion of the second interlayer insulating layer 122. A channel is formed in the epitaxial layers 107 according to a voltage applied to the source region 105 and the gate electrode 131, facilitating electrical connection between the source region 105 and the ground select transistor GST, and thus, operational characteristics such as current characteristics of the non-volatile memory device 100b may be improved.

In some embodiments, the epitaxial layers 107 may be formed by forming the openings H as described above with reference to FIG. 8 and subsequently performing a selective epitaxial growth (SEG) process using the exposed portions of the substrate 101 as a seed. After the epitaxial layers 107 are formed, the anti-oxidation layers 140 may then be formed.

Figure 21:
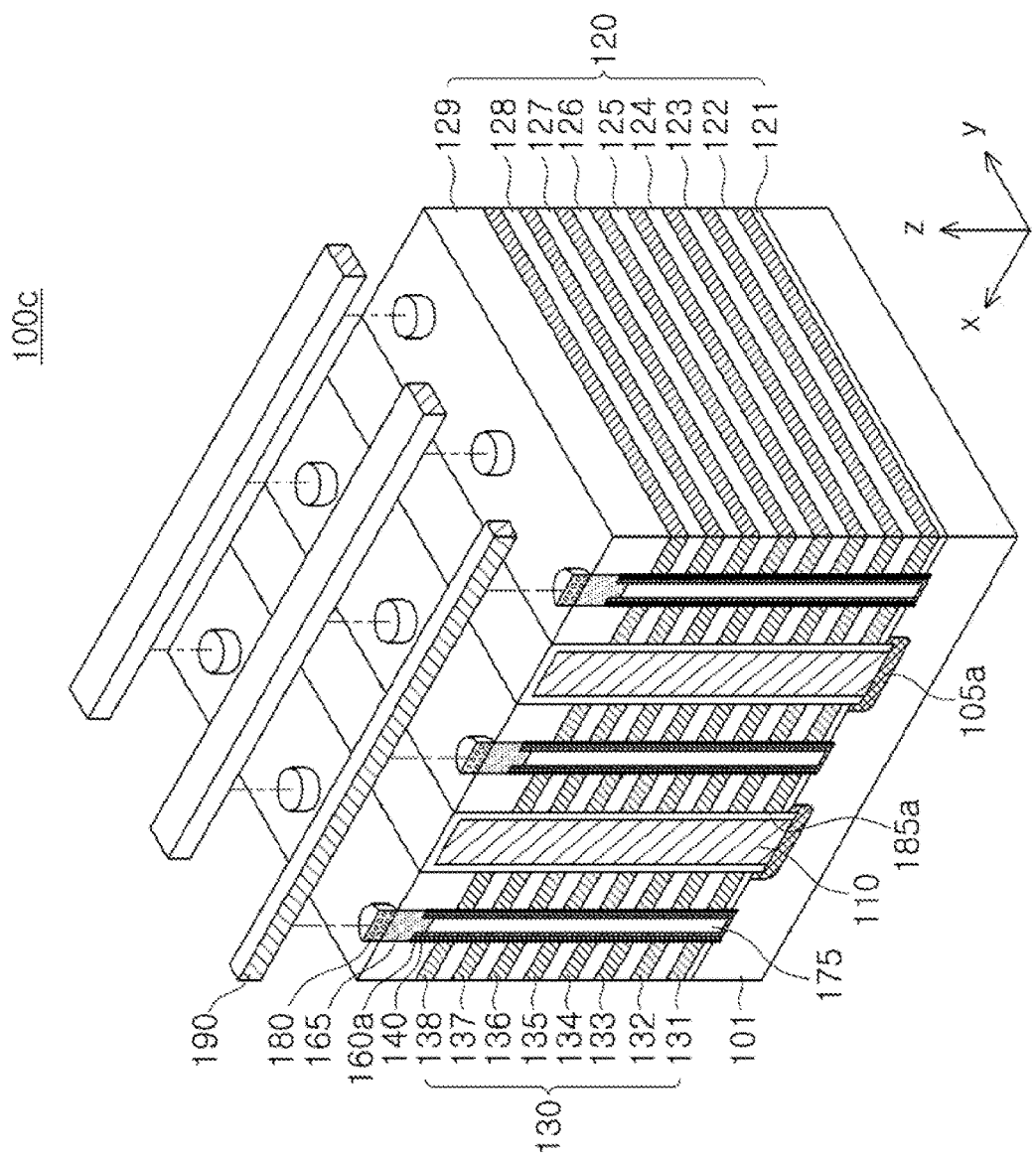
FIG. 21 is an exploded perspective view schematically illustrating a structure of memory cell strings of a non-volatile memory device according to an exemplary embodiment of the present disclosure.

FIG. 21 is an exploded perspective view schematically illustrating a structure of memory cell strings of a non-volatile memory device according to an exemplary embodiment of the present disclosure.

Referring to FIG. 21, a non-volatile memory device 100c may include channel regions 160a that are disposed perpendicularly on the substrate 101 and a plurality of interlayer insulating layers 120 and a plurality of gate electrodes 130 that are disposed along outer side walls of the channel regions 160a. The non-volatile memory device 100c further includes the anti-oxidation layers 140 and the gate dielectric layers 150, which are disposed between the gate electrodes 130 and the channel regions 160a. Bit lines 190 are disposed in upper portions of the common source line 110 of the source regions 105a and the channel regions 160a.

In the present exemplary embodiment, unlike the exemplary embodiment of FIG. 3, a source region 105a may be disposed in each channel region 160a in the x direction. Also, the channel regions 160a may be connected to each other on the underlying substrate 101 to cover the upper surface of the substrate 101.

A common source line 110 may extend in the z direction on each source region 105a and may be arranged to be in ohmic-contact with the source region 105a. Each common source line 110 may extend in the y direction along its respective source region 105a. The common source line 110 may include a conductive material. For example, the common source line 110 may include tungsten (W), aluminum (Al), or copper (Cu). A separation insulating layer 185a may be formed on an upper portion and on lateral surfaces of each common source line 110 to insulate the common source line 110 from the gate electrodes 130.

Figure 22:
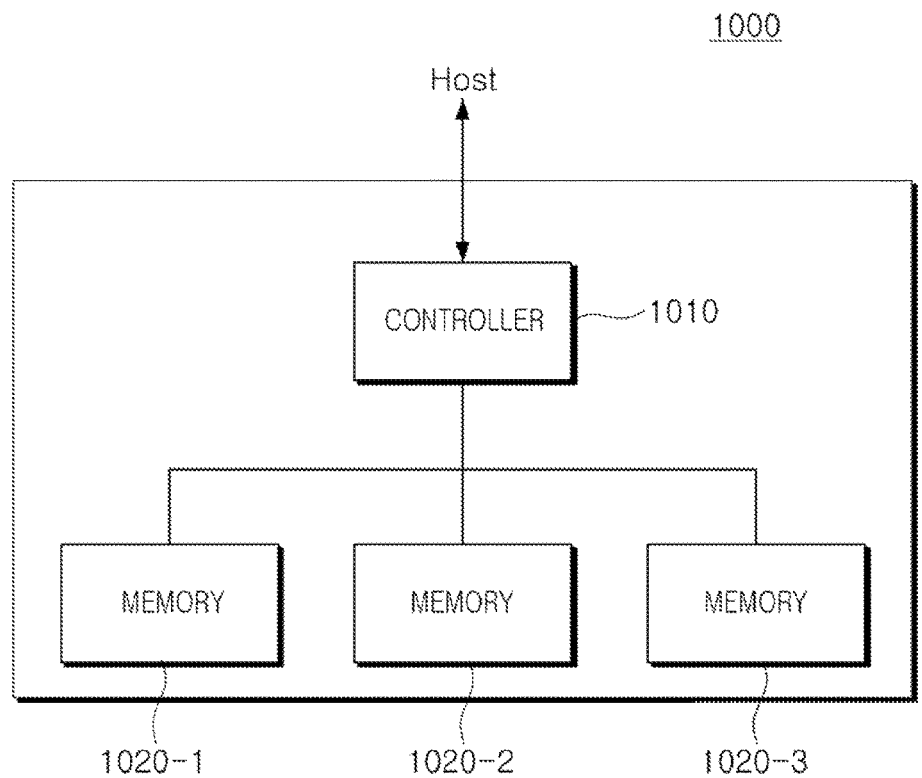
FIG. 22 is a block diagram illustrating a storage device including a non-volatile memory device according to an exemplary embodiment of the present disclosure.

FIG. 22 is a block diagram illustrating a storage device that includes a non-volatile memory device according to an exemplary embodiment of the present disclosure.

Referring to FIG. 22, a storage device 1000 may include a controller 1010 communicating with a host HOST and memories 1020-1, 1020-2, and 1020-3 storing data. Each of the memories 1020-1, 1020-2, and 1020-3 may include the non-volatile memory devices according to various exemplary embodiments of the present disclosure as described above with reference to FIGS. 1 through 21.

The host HOST may be an electronic device in which the storage device 100 is installed. For example, the host HOST may be a smartphone, a digital camera, a desktop computer, a laptop computer, a media player, or the like. When a data write or read request is received from the host HOST, the controller 1010 may store data in the memories 1020-1, 1020-2, and 1020-3 or generate a command CMD to retrieve data from the memories 1020-1, 1020-2, and 1020-3.

As illustrated in FIG. 22, one or more memories 1020-1, 1020-2, and 1020-3 may be connected to the controller 1010 in parallel within the storage device 1000. By connecting the plurality of memories 1020-1, 1020-2, and 1020-3 to the controller 1010 in parallel, a storage device 1000 having large capacity, such as a solid state drive (SSD), may be implemented.

Figure 23:
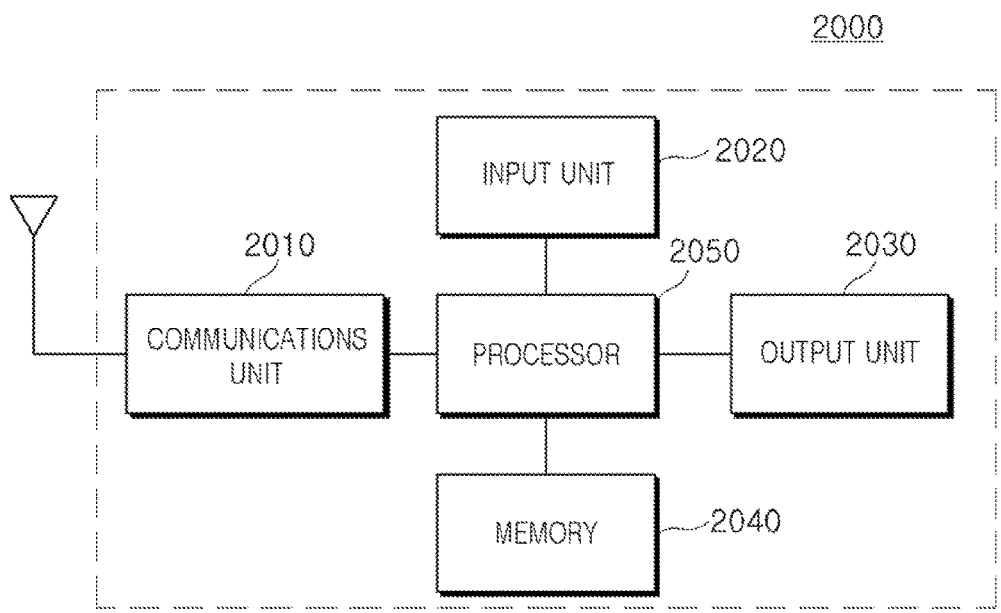
FIG. 23 is a block diagram illustrating an electronic device including a non-volatile memory device according to an exemplary embodiment of the present disclosure.

FIG. 23 is a block diagram illustrating an electronic device that includes a non-volatile memory device according to an exemplary embodiment of the present disclosure.

Referring to FIG. 23, an electronic device 2000 according to the present exemplary embodiment may include a communications unit 2010, an input unit 2020, an output unit 2030, a memory 2040, and a processor 2050.

The communications unit 2010 may include a wired/wireless communications module, and may include a wireless Internet module, a short-range communications module, a global positioning system (GPS) module, a mobile communications module, and the like. A wired/wireless communications module included in the communications unit 2010 may be connected to an external communication network based on various communication standards to transmit and receive data.

The input unit 2020, which allows a user to control operation of the electronic device 2000, may include a mechanical switch, a touchscreen, a voice recognition module and the like. Also, the input unit 2020 may include a mouse operating in a track ball or a laser pointer manner, or the like, or a finger mouse device. In addition, the input unit 2020 may further include various sensor modules allowing the user to input data.

The output unit 2030 outputs information processed in the electronic device 2000 in an audio or video format, and the memory 2040 may store a program for processing and controlling the processor 2050, data, or the like. The memory 2040 may include one or more non-volatile memory devices according to various exemplary embodiments of the present disclosure as described above with reference to FIGS. 1 through 21. The processor 2050 may deliver a command to the memory 2040 according to a necessary operation in order to store data to the memory 2040 or retrieve data therefrom.

The memory 2040 may be installed in the electronic device 2000 or communicate with the processor 2050 through a separate interface. In the case in which the memory 240 communicates with the processor 2050 through a separate interface, the processor 2050 may store data to the memory 2040 or retrieve data therefrom through various interface standards such as SD, SDHC, SDXC, MICRO SD, USB, or the like.

The processor 2050 controls operations of respective components included in the electronic device 2000. The processor 2050 may perform controlling and processing related to an audio call, a video call, data communication, and the like, or may perform controlling and processing for multimedia playback and management. Also, the processor 2050 may process an input delivered from the user through the input unit 2020 and output corresponding results through the output unit 2030. Further, the processor 2050 may store data required for controlling an operation of the electronic device 2000 to the memory 2040 or retrieve such data therefrom.

As set forth above, according to exemplary embodiments of the present disclosure, by forming anti-oxidation layers that protect the gate electrodes from oxidation, a non-volatile memory device having improved reliability and a manufacturing method thereof may be provided.

Advantages and effects of the present disclosure are not limited to the foregoing content and any other technical effects not mentioned herein may be easily understood by a person skilled in the art from the foregoing description.

While exemplary embodiments have been shown and described above, it will be apparent to those skilled in the art that modifications and variations could be made without departing from the spirit and scope of the present disclosure as defined by the appended claims.

What is claimed is:

1. A non-volatile memory device, comprising:
    a channel region extending in a direction perpendicular to an upper surface of a substrate;
    gate electrodes and interlayer insulating layers alternately stacked on the upper surface of the substrate along outer side walls of the channel region to provide a vertical stack of layers;
    a gate dielectric layer including a tunneling layer, an electric charge storage layer, and a blocking layer including a high-k layer and a low-k layer that is between the high-k layer and the electric charge storage layer, the tunneling layer, the electric charge storage layer, and the blocking layer being sequentially disposed between the channel region and the gate electrodes; and
    an anti-oxidation layer disposed on contiguous layers of the vertical stack of layers and between the blocking layer and the gate electrodes.

2. The non-volatile memory device of claim 1, wherein the anti-oxidation layer extends along the channel region perpendicular to the upper surface of the substrate from a bottom gate electrode that is closest to the substrate to a top gate electrode that is farthest away from the substrate.

3. The non-volatile memory device of claim 1, wherein the anti-oxidation layer has a substantially uniform thickness along the channel region.

4. The non-volatile memory device of claim 3, wherein a difference between a thickness of a first region of the anti-oxidation layer that contacts a bottom gate electrode of the gate electrodes and a thickness of a second region that contacts a top gate electrode of the gate electrodes is less than or equal to 25% of an average thickness of the anti-oxidation layer.

5. The non-volatile memory device of claim 1, wherein the anti-oxidation layer comprises a dielectric material that is different from that of the high-k layer.

6. The non-volatile memory device of claim 5, wherein the anti-oxidation layer has a dielectric constant that is less than a dielectric constant of the high-k layer.

7. The non-volatile memory device of claim 1, wherein the anti-oxidation layer has a thickness that is less than that of the low-k layer.

8. The non-volatile memory device of claim 1, wherein the gate electrodes comprise metal silicide, and the blocking layer comprise an oxide.

9. The non-volatile memory device of claim 1, wherein the anti-oxidation layer is disposed on lateral surface regions of the gate electrodes that face the channel region.

10. The non-volatile memory device of claim 1, wherein further comprising an epitaxial layer disposed on the substrate in a lower portion of the channel region.

11. A non-volatile memory device, comprising:
    a plurality of insulating layers and a plurality of conductive layers alternatively stacked on a top surface of a substrate;

a channel hole penetrating through the plurality of insulating layers and the plurality of conductive layers to expose lateral surfaces of the plurality of insulating layers and the plurality of conductive layers;

an anti-oxidation layer disposed on the lateral surfaces of the plurality of insulating layers and the plurality of conductive layers;

a gate dielectric layer disposed on the anti-oxidation layer, the gate dielectric layer including a blocking layer, an electric charge storage layer, and a tunneling layer that are sequentially formed on the anti-oxidation layer;

a channel region disposed on the tunneling layer; and separation layers penetrating through the plurality of insulating layers and the plurality of conductive layers, wherein the channel hole is disposed between the separation layers, and wherein the anti-oxidation layer is interposed between the gate dielectric layer and the lateral surfaces of the plurality of insulating layers and the plurality of conductive layers.

12. The non-volatile memory device of claim 11, wherein the anti-oxidation layer comprises a dielectric material that is different than a dielectric material of a portion of the blocking layer that contacts the anti-oxidation layer.

13. The non-volatile memory device of claim 11, wherein the blocking layer is a multi-layer structure having a first blocking layer that includes a low dielectric constant material that contacts the electric charge storage layer and a second blocking layer that includes a high dielectric constant material between the first blocking layer and the anti-oxidation layer, wherein the low dielectric constant material has a dielectric value that is less than a dielectric value for the high dielectric constant material.

14. The non-volatile memory device of claim 13, wherein the anti-oxidation layer has a dielectric constant that is lower than a dielectric constant of the second blocking layer.

15. A non-volatile memory device, comprising:

interlayer insulating layers and conductive layers alternatively stacked on a substrate;

channel holes penetrating through the interlayer insulating layers and the conductive layers, the channel holes exposing the substrate;

anti-oxidation layers on the conductive layers exposed through side walls of the channel holes;

a gate dielectric layer including a blocking layer including a high-k layer and a low-k layer, an electric charge storage layer, and a tunneling layer sequentially formed on the anti-oxidation layers; and a channel region on the gate dielectric layer, wherein the anti-oxidation layers have a dielectric constant that is less than a dielectric constant of the high-k layer, and wherein upper surfaces of the anti-oxidation layers are coplanar with upper surfaces of the conductive layers.

16. The non-volatile memory device of claim 15, wherein the anti-oxidation layers comprises a dielectric material that is different than a dielectric material of a portion of the blocking layer that contacts the anti-oxidation layers.

17. The non-volatile memory device of claim 15, wherein the anti-oxidation layers are discontinuous between adjacent ones of the conductive layers.

18. The non-volatile memory device of claim 15, wherein lateral surfaces of the anti-oxidation layers that are opposite the conductive layers are non-coplanar with lateral surfaces of the interlayer insulating layers.

19. The non-volatile memory device of claim 15, wherein the blocking layer is on contiguous layers of the interlayer insulating layers, and wherein the blocking layer includes respective bent portions at respective boundaries between the interlayer insulating layers and the conductive layers.

20. The non-volatile memory device of claim 15, wherein the anti-oxidation layers are not interposed the interlayer insulating layers and the conductive layers.

* * * * *